United States Patent
Yun et al.

(10) Patent No.: US 11,768,432 B2
(45) Date of Patent: Sep. 26, 2023

(54) REFLECTIVE MASK AND METHOD FOR MANUFACTURING A SEMICONDUCTOR DEVICE USING THE SAME

(71) Applicant: SAMSUNG ELECTRONICS CO., LTD., Suwon-si (KR)

(72) Inventors: Sang-Ho Yun, Yongin-si (KR); Soo Kyung Kim, Seongnam-si (KR); Jaikyun Park, Hwaseong-si (KR); Donghoon Lee, Gwacheon-si (KR); Rankyung Jung, Seoul (KR); Soonmok Ha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 214 days.

(21) Appl. No.: 17/407,425

(22) Filed: Aug. 20, 2021

(65) Prior Publication Data
US 2022/0091497 A1    Mar. 24, 2022

(30) Foreign Application Priority Data

Sep. 21, 2020   (KR) .......................... 10-2020-0121771

(51) Int. Cl.
*G03F 1/24*       (2012.01)
*H01L 21/027*     (2006.01)

(52) U.S. Cl.
CPC ............ *G03F 1/24* (2013.01); *H01L 21/0274* (2013.01)

(58) Field of Classification Search
CPC .......................................................... G03F 1/24
USPC ............................................................ 430/5
See application file for complete search history.

(56) References Cited

U.S. PATENT DOCUMENTS

| | | |
|---|---|---|
| 8,841,219 B2 | 9/2014 | Park et al. |
| 9,081,288 B2 | 7/2015 | Shih et al. |
| 9,116,438 B2 | 8/2015 | Lee et al. |
| 9,182,659 B2 | 11/2015 | Lu et al. |
| 9,874,809 B2 | 1/2018 | Park et al. |
| 10,036,961 B2 | 7/2018 | Jang et al. |
| 2011/0117479 A1 | 5/2011 | Suga et al. |
| 2012/0224156 A1 | 9/2012 | Lee et al. |
| 2012/0284675 A1 | 11/2012 | Shiely et al. |
| 2013/0185681 A1 | 7/2013 | Liu et al. |
| 2020/0066648 A1 | 2/2020 | Chen et al. |

FOREIGN PATENT DOCUMENTS

| | | |
|---|---|---|
| KR | 10-1757743 B1 | 7/2017 |
| KR | 10-1845273 B1 | 5/2018 |
| KR | 10-1999865 B1 | 7/2019 |

*Primary Examiner* — Christopher G Young
(74) *Attorney, Agent, or Firm* — Lee IP Law, P.C.

(57) ABSTRACT

A reflective mask includes a central region and first and second peripheral regions at opposite sides of the central region, respectively, the first peripheral region including a first out-of-band region having a first edge region extending in a first direction, and a first expansion region between the first edge region and the central region, and a first outer auxiliary region adjacent to the first expansion region of the first out-of-band region in the first direction, the first outer auxiliary region having a first auxiliary pattern region.

20 Claims, 22 Drawing Sheets

REFLECTIVE MASK AND METHOD FOR MANUFACTURING A SEMICONDUCTOR DEVICE USING THE SAME

CROSS-REFERENCE TO RELATED APPLICATION

Korean Patent Application No. 10-2020-0121771, filed on Sep. 21, 2020, in the Korean Intellectual Property Office, and entitled: "Reflective Mask and Method for Manufacturing a Semiconductor Device Using the Same," is incorporated by reference herein in its entirety.

BACKGROUND

1. Field

Embodiments relate to a reflective mask used in an extreme ultraviolet (EUV) exposure process and a method for manufacturing a semiconductor device using the same.

2. Description of the Related Art

As an integration density of semiconductor devices has been increased, exposure apparatuses using extreme ultraviolet (EUV) light having a shorter wavelength than deep ultraviolet (DUV) light as a light source have been actively developed to improve resolution. The EUV exposure apparatus may use a reflective mask using reflection properties of the EUV light.

SUMMARY

In an aspect, a reflective mask may include a central region, and a first peripheral region and a second peripheral region which are disposed at both sides of the central region, respectively. The first peripheral region may include a first out-of-band region and a first outer auxiliary region, and the first outer auxiliary region may include a first auxiliary pattern region. The first out-of-band region may include a first edge region extending in a first direction, and a first expansion region disposed between the first edge region and the central region. The first outer auxiliary region may be adjacent to the first expansion region in the first direction.

In an aspect, a reflective mask may include a central region; an out-of-band region surrounding the central region, the out-of-band region including a first inner sidewall, a second inner sidewall, a third inner sidewall, and a fourth inner sidewall, the first and second inner sidewalls extending in a first direction, the third and fourth inner sidewalls extending in a second direction, the first and second inner sidewalls opposite to each other in the second direction, and the third and fourth inner sidewalls opposite to each other in the first direction; a first expansion region on the first inner sidewall; a second expansion region on the second inner sidewall; a first outer auxiliary region on the second inner sidewall; and a second outer auxiliary region on the first inner sidewall. Each of the first and second expansion regions may be an expanded region of the out-of-band region. Each of the first and second outer auxiliary regions may be configured to transfer an auxiliary pattern in a scribe line region of a substrate. The first expansion region and the first outer auxiliary region may be symmetrical with respect to a first center line extending in the first direction and passing through a center of the central region. The second expansion region and the second outer auxiliary region may be symmetrical with respect to the first center line.

In an aspect, a method for manufacturing a semiconductor device may include performing an EUV lithography process on a substrate. The substrate may include a first chip region, a second chip region, and a scribe line region between the first and second chip regions. The performing of the EUV lithography process may include performing a first exposure on the first chip region and the scribe line region of the substrate, and performing a second exposure on the scribe line region and the second chip region of the substrate. In the first exposure, a first exposure region on the substrate may be exposed and a first blocking region on the substrate may not be exposed. In the second exposure, a second exposure region on the substrate may be exposed and a second blocking region on the substrate may not be exposed. The first exposure region may overlap with a first region of the scribe line region, and the first blocking region may overlap with a second region of the scribe line region. The second exposure region may overlap with the second region of the scribe line region, and the second blocking region may overlap with the first region of the scribe line region.

In an aspect, a semiconductor device may include a substrate including a chip region and a scribe line region, active patterns provided on the chip region, and first key patterns provided on the scribe line region. The first key patterns may be located at the same level as the active patterns. The first key patterns may be continuously arranged at a first pitch via a center line of the scribe line region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
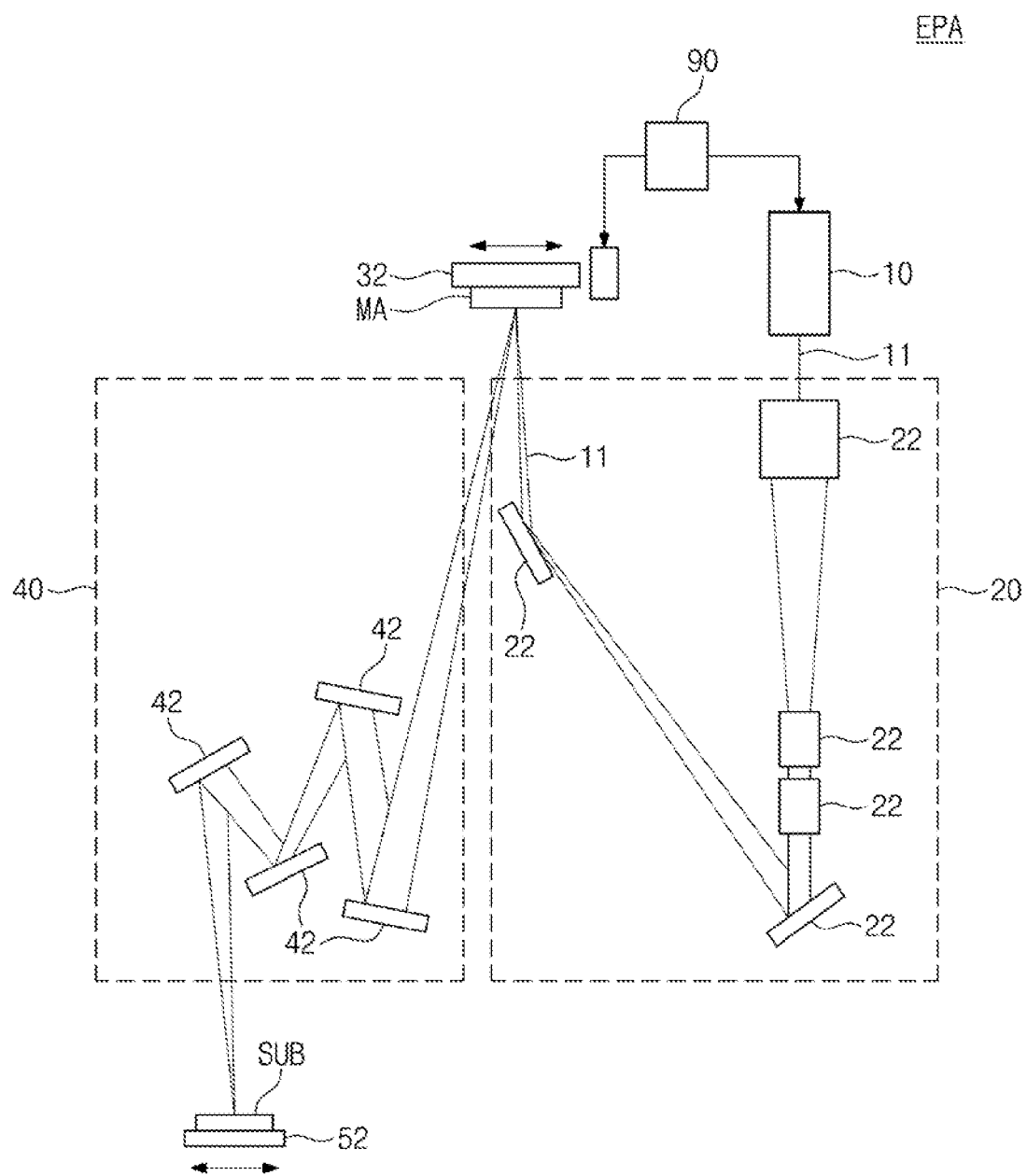
FIG. 1 is a schematic view illustrating an extreme ultraviolet (EUV) exposure apparatus according to some embodiments.

FIG. 1 is a schematic view of an extreme ultraviolet (EUV) exposure apparatus according to some embodiments.

Referring to FIG. 1, an EUV exposure apparatus EPA may include an optical source 10, a condenser 20, a projector 40, and a controller 90.

The optical source 10 may generate EUV light, e.g., light having a wavelength of about 4 nm to about 124 nm. In some embodiments, the optical source 10 may generate EUV light, e.g., having a wavelength of about 13.5 nm. The optical source 10 may generate light having energy of about 6.21 eV to about 124 eV, e.g., energy of about 90 eV to about 95 eV. The optical source 10 may generate the EUV light but may also undesirably generate deep ultraviolet (DUV) light (e.g., light having a wavelength of about 100 nm to about 300 nm).

The condenser 20 may guide light 11 generated from the optical source 10 toward a reflective mask MA loaded on a mask stage 32. The condenser 20 may guide the light 11 in such a way that the light 11 is reflected from the reflective mask MA.

The condenser 20 may include a condenser optics 22, e.g., a lens and/or a mirror. The condenser optics 22 may condense and reflect the light 11 from the optical source 10 toward the reflective mask MA. The light 11 may be, e.g., obliquely, incident on the reflective mask MA through the condenser 20. The mask stage 32 may move the reflective mask MA in a scan direction of the reflective mask MA, e.g., along the direction of the arrows in FIG. 1. The optical source 10 and the mask stage 32 may be controlled by the controller 90.

The light 11 incident on the reflective mask MA may be reflected by the reflective mask MA toward the projector 40, and then may be, e.g., obliquely, incident on the projector 40. The projector 40 may project a mask pattern (e.g., an absorption pattern) of the reflective mask MA onto a substrate SUB located on a substrate stage 52. For example, the substrate SUB may be a silicon wafer on which an integrated circuit is formed. A photoresist capable of reacting to light may be coated on the substrate SUB. The substrate stage 52 may move the substrate SUB to change an exposure region (or an exposure position) of the substrate SUB.

The projector 40 may include a reflective projection optics 42, e.g., at least one mirror. The reflective projection optics 42 may project the mask pattern of the reflective mask MA onto the substrate SUB at a predetermined magnification (e.g., ¼, ⅙, or ⅛) by using the light 11, e.g., obliquely, reflected from the reflective mask MA.

Figure 2:
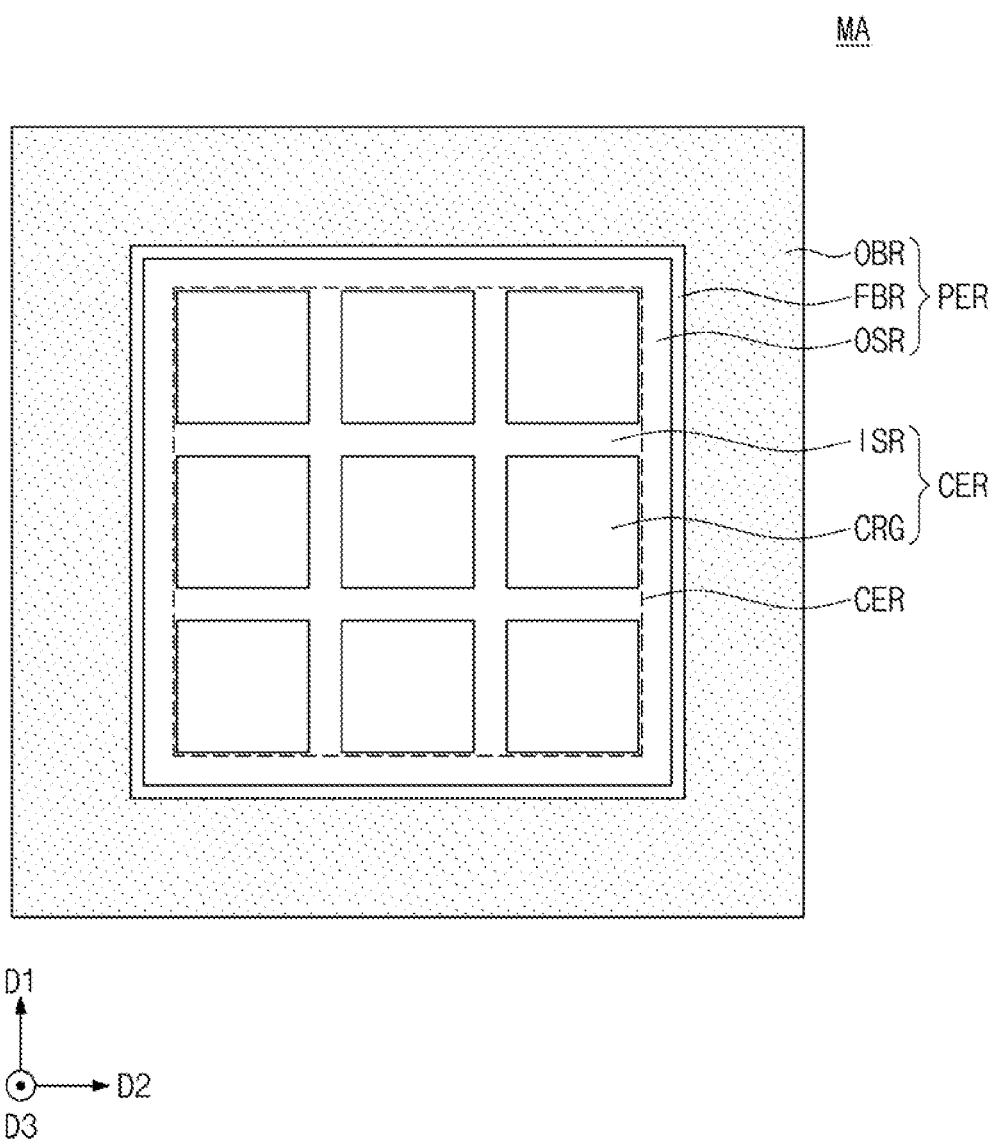
FIG. 2 is a plan view of a reflective mask applied to the EUV exposure apparatus of FIG. 1.

FIG. 2 is a plan view of the reflective mask MA in the EUV exposure apparatus EPA of FIG. 1. Referring to FIG. 2, the reflective mask MA may include a central region CER and a peripheral region PER surrounding, e.g., an entire perimeter of, the central region CER (in a top view).

In detail, as illustrated in FIG. 2, the central region CER of the reflective mask MA may include main regions CRG and an inner auxiliary region ISR between the main regions CRG. The main regions CRG may correspond to chip regions of the substrate SUB of FIG. 1, respectively. Each of the main regions CRG may transfer or project patterns constituting an integrated circuit in the chip region of the substrate SUB of FIG. 1. The main regions CRG may be two-dimensionally arranged, e.g., the main regions CRG may be spaced apart from each other in two directions to define a matrix pattern. For example, the inner auxiliary region ISR may extend continuously in spaces between adjacent one of the main regions CRG, e.g., in a grid pattern. The inner auxiliary region ISR may transfer or project auxiliary patterns in a scribe line region of the substrate SUB of FIG. 1.

The peripheral region PER of the reflective mask MA may include an outer auxiliary region OSR, an out-of-band region OBR, and a buffer region FBR therebetween. The outer auxiliary region OSR may surround, e.g., an entire perimeter of, the central region CER (in a top view). Like the inner auxiliary region ISR, the outer auxiliary region OSR may transfer or project auxiliary patterns in the scribe line region of the substrate SUB of FIG. 1, e.g., the inner auxiliary region ISR and the outer auxiliary region OSR may contact each other to define an integral structure.

The out-of-band region OBR may form a border or an edge of the reflective mask MA, e.g., surround an entire perimeter of the outer auxiliary region OSR. The out-of-band region OBR may not reflect light incident on the reflective mask MA but may absorb or scatter the, e.g., entirety, of the light incident on the out-of-band region OBR. For example, the out-of-band region OBR may absorb the EUV light and may scatter the DUV light.

The buffer region FBR may be an intermediate region between the out-of-band region OBR and the outer auxiliary region OSR, and may not absorb light as much as the out-of-band region OBR. In other words, there is a possibility that light may be reflected from the buffer region FBR. Light reflected by the buffer region FBR may affect other pattern(s).

The central region CER and the outer auxiliary region OSR of the reflective mask MA may reflect light incident on the reflective mask MA. In other words, patterns formed in the central region CER and the outer auxiliary region OSR may be transferred or projected onto the substrate SUB of FIG. 1. Since light is not reflected from the out-of-band region OBR, patterns formed in the out-of-band region OBR may not be transferred onto the substrate SUB.

Figure 3:
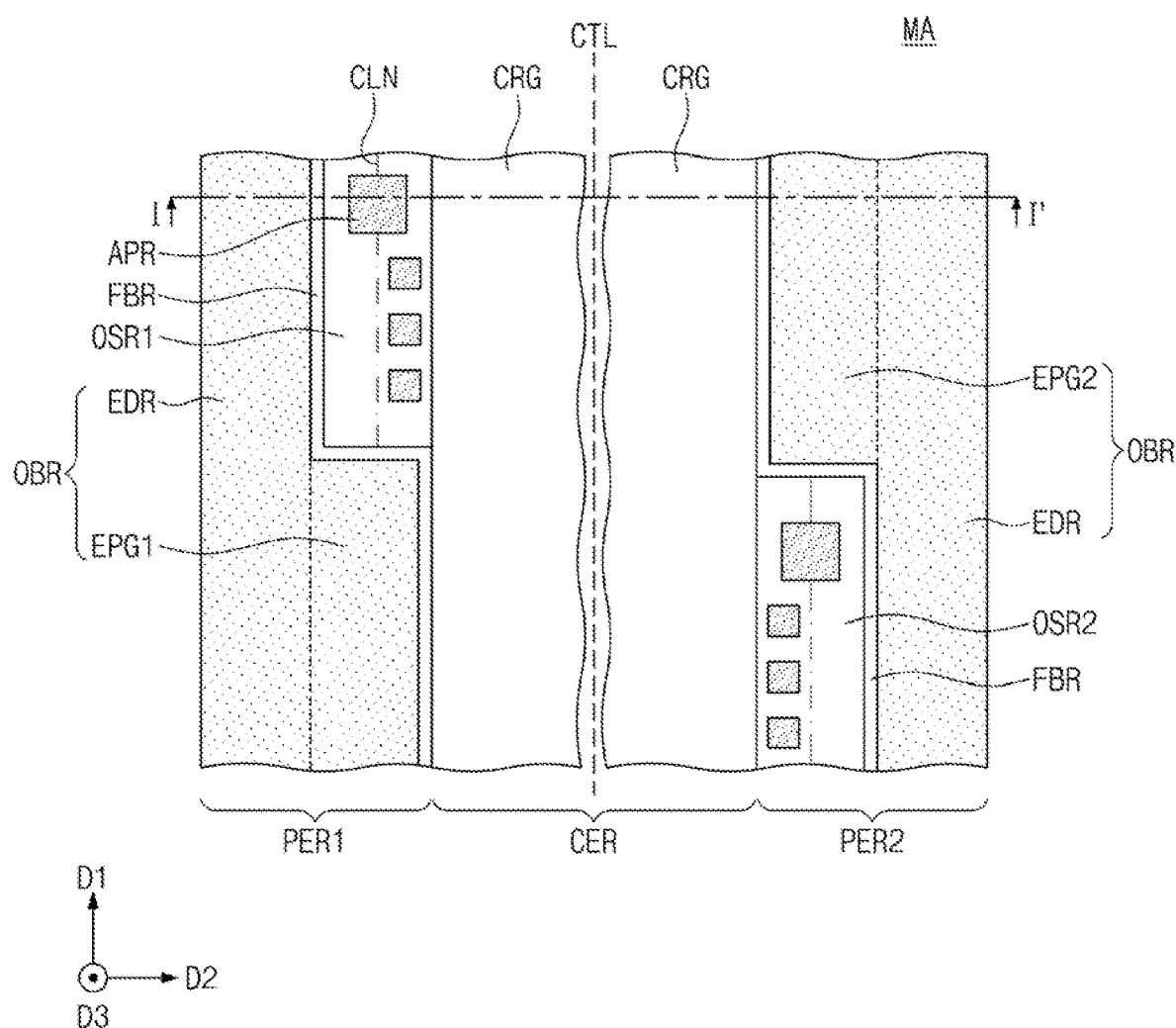
FIG. 3 is a detailed plan view of the reflective mask of FIG. 2.
Figure 4:
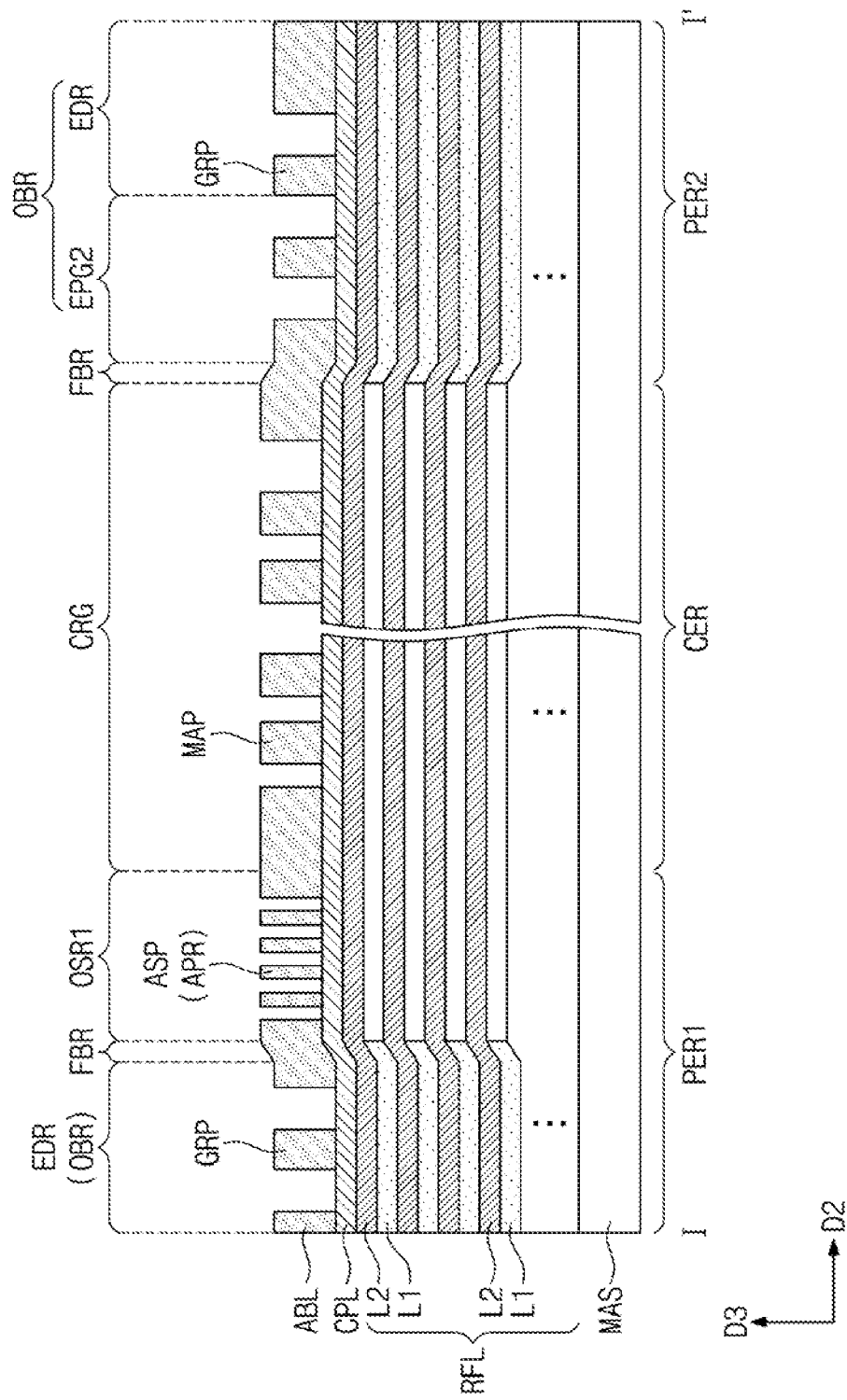
FIG. 4 is a cross-sectional view taken along line I-I' of FIG. 3.

FIG. 3 is a detailed plan view of the reflective mask MA of FIG. 2. FIG. 4 is a cross-sectional view taken along line I-I' of FIG. 3. It is noted that FIG. 3 illustrates a view of two portions of two main regions CRG, respectively, spaced apart from each other (via center line CTL) with portions of the peripheral region PER adjacent to each of the corresponding two main regions CRG. For convenience, the portions of the peripheral region PER adjacent to the two main regions CRG in FIG. 3 are referred to as first and second peripheral regions PER1 and PER2, respectively. Therefore, the first and second peripheral regions PER1 and PER2 in FIG. 3 are (e.g., opposite) portions of the peripheral region PER in FIG. 2, and the first and second outer auxiliary region OSR1 and OSR2 in FIG. 3 are (e.g., opposite) portions of the outer auxiliary region OSR in FIG. 2.

Referring to FIG. 3, the reflective mask MA may include the central region CER and the first and second peripheral regions PER1 and PER2 disposed at both, e.g., opposite, sides of the central region CER, respectively. The out-of-band region OBR of the first peripheral region PER1 may include an edge region EDR extending in a first direction D1 and a first expansion region EPG1 disposed between the edge region EDR and the central region CER. For example, as illustrated in FIG. 3, the edge region EDR may have a linear shape along the first direction D1, and the first expansion region EPG1 may have a linear shape extending along only part of the edge region EDR, e.g., the first expansion region EPG1 may be shorter than the edge region EDR along the first direction D1. The first outer auxiliary region OSR1 of the first peripheral region PER1 may be adjacent to the first expansion region EPG1 in the first direction D1, e.g., the first outer auxiliary region OSR1 and the first expansion region EPG1 may extend along different portions of the edge region EDR along the first direction D1.

The buffer region FBR in the first peripheral region PER1 may extend in the first direction D1 between the first expansion region EPG1 and the central region CER, may extend in a second direction D2 between the first expansion region EPG1 and the first outer auxiliary region OSR1, and may extend in the first direction D1 between the edge region EDR and the first outer auxiliary region OSR1. In other words, the buffer region FBR may extend, e.g., conformally, along a profile of the out-of-band region OBR.

The first outer auxiliary region OSR1 may include auxiliary pattern regions APR. Each of the auxiliary pattern regions APR may include patterns for defining auxiliary patterns (e.g., key patterns) in the scribe line region. At least one of the auxiliary pattern regions APR may be disposed on a center line CLN of the first outer auxiliary region OSR1. For example, as illustrated in FIG. 3, the center line CLN of the first outer auxiliary region OSR1 may extend in the first direction D1 through a center of the first outer auxiliary region OSR1, as viewed in a top view, e.g., the center line CLN may extend along the first direction D1 equidistantly from edges of the first outer auxiliary region OSR1 (dahs-dotted line in FIG. 3).

The out-of-band region OBR of the second peripheral region PER2 may include the edge region EDR extending in the first direction D1 and a second expansion region EPG2 disposed between the edge region EDR and the central region CER. The second expansion region EPG2 may be adjacent to the second outer auxiliary region OSR2 of the second peripheral region PER2 in the first direction D1.

The buffer region FBR in the second peripheral region PER2 may extend in the first direction D1 between the second expansion region EPG2 and the central region CER, may extend in the second direction D2 between the second expansion region EPG2 and the second outer auxiliary region OSR2, and may extend in the first direction D1 between the edge region EDR and the second outer auxiliary region OSR2.

The second outer auxiliary region OSR2 may include the auxiliary pattern regions APR. At least one of the auxiliary pattern regions APR may be disposed on the center line CLN of the second outer auxiliary region OSR2.

The center line CTL passing through a center of the reflective mask MA and extending in the first direction D1 may be defined, e.g., the center line CTL may extend equidistantly from and between opposite outermost edges of the first and second peripheral regions PER1 and PER2 of the reflective mask MA. The first outer auxiliary region OSR1 and the second expansion region EPG2 may be disposed symmetrically with respect to the center line CTL. For example, if the reflective mask MA is folded along the center line CTL, the first outer auxiliary region OSR1 and the second expansion region EPG2 may completely overlap with each other. The second outer auxiliary region OSR2 and the first expansion region EPG1 may be disposed symmetrically with respect to the center line CTL. For example, if the reflective mask MA is folded along the center line CTL, the second outer auxiliary region OSR2 and the first expansion region EPG1 may completely overlap with each other.

Referring to FIGS. 3 and 4, the reflective mask MA may include a mask substrate (or a reticle substrate) MAS, a reflective layer RFL, a capping layer CPL, and an absorption layer ABL. For example, as illustrated in FIGS. 4, the reflective layer RFL and the capping layer CPL are continuous on, e.g., the entire, mask substrate MAS. For example, referring to FIGS. 1 and 4, when the reflective mask MA is placed on the mask stage 32, the mask substrate MAS faces the mask stage 32, and the absorption layer ABL faces the projector 40.

The mask substrate MAS may be a glass or quartz substrate. The reflective layer RFL may be disposed on the mask substrate MAS. The reflective layer RFL may reflect incident light. For example, the reflective layer RFL may have a multi-layered structure in which a first layer L1 and a second layer L2 are alternately and repeatedly stacked 30 times to 60 times. For example, the first layer L1 may include silicon (Si) and/or a silicon compound. The second layer L2 may include molybdenum (Mo) and/or a molybdenum compound.

The capping layer CPL may be provided on the reflective layer RFL to protect the reflective layer RFL. For example, the capping layer CPL may include ruthenium (Ru) or ruthenium oxide. In certain embodiments, the capping layer CPL may be omitted.

The absorption layer ABL may be provided on the capping layer CPL. The absorption layer ABL may include an inorganic material or a metal. The absorption layer ABL may include a tantalum (Ta)-based compound. For example, the absorption layer ABL may include TaN, TaBN, or TaBON. However, embodiments are not limited thereto. In certain embodiments, the absorption layer ABL may include other opaque inorganic material or metal, e.g., Cr, CrO, Ni, Cu, Mo, Al, Ti, W, or Ru. The absorption layer ABL may be exposed to the outside of the reflective mask MA.

The absorption layer ABL of the out-of-band region OBR may include grating patterns GRP. In other words, the absorption layer ABL of the out-of-band region OBR may have a grating shape. The grating patterns GRP of the absorption layer ABL may scatter incident light. For example, the grating patterns GRP may effectively scatter the DUV light to prevent the DUV light from being reflected.

The reflective layer RFL of the out-of-band region OBR may be treated by an optical density (OD) treatment, e.g., a laser annealing, and thus the reflective layer RFL may not reflect light. In other words, the reflective layer RFL of the out-of-band region OBR may absorb light. For example, the first layer L1 in the out-of-band region OBR may be changed from silicon (Si) into silicon nitride (SiN) by the optical density (OD) treatment.

In some embodiments, the absorption layer ABL of the out-of-band region OBR may be located at a lower level than the absorption layer ABL of the main region CRG. However, embodiments are not limited thereto. In certain embodiments, the absorption layer ABL of the out-of-band region OBR may be located at the same level as or a higher level than the absorption layer ABL of the main region CRG.

The absorption layer ABL of the first outer auxiliary region OSR1 may include a plurality of auxiliary patterns ASP. The auxiliary patterns ASP may have a constant width and a constant pitch, e.g., the width and pitch of the auxiliary patterns ASP may be smaller than those of the grating patterns GRP in the out-of-band region OBR (FIG. 4). The auxiliary patterns ASP may constitute the auxiliary pattern region APR.

The absorption layer ABL of the main region CRG may include a plurality of main patterns MAP, e.g., patterns to transform circuit patterns onto the substrate SUB. For example, light incident on the absorption layer ABL of the main region CRG may be reflected by the reflective layer RFL toward the substrate SUB.

For example, as illustrated in FIG. 4, the absorption layer ABL of the buffer region FBR may extend continuously between the edge region EDR of the out-of-band region OBR and the first outer auxiliary region OSR1, e.g., to at least partially extend across the boundary into the first outer auxiliary region OSR1 to minimize reflection of undesirable light, and may extend continuously between the second expansion region EPG2 of the out-of-band region OBR and the main region CRG, e.g., to at least partially extend across the boundary into the main region CRG to minimize reflection of undesirable light.

For example, the second expansion region EPG2 may be connected to the edge region EDR to form the out-of-band region OBR. The grating patterns GRP may be continuously arranged in the second expansion region EPG2 and the edge region EDR.

Figure 5:
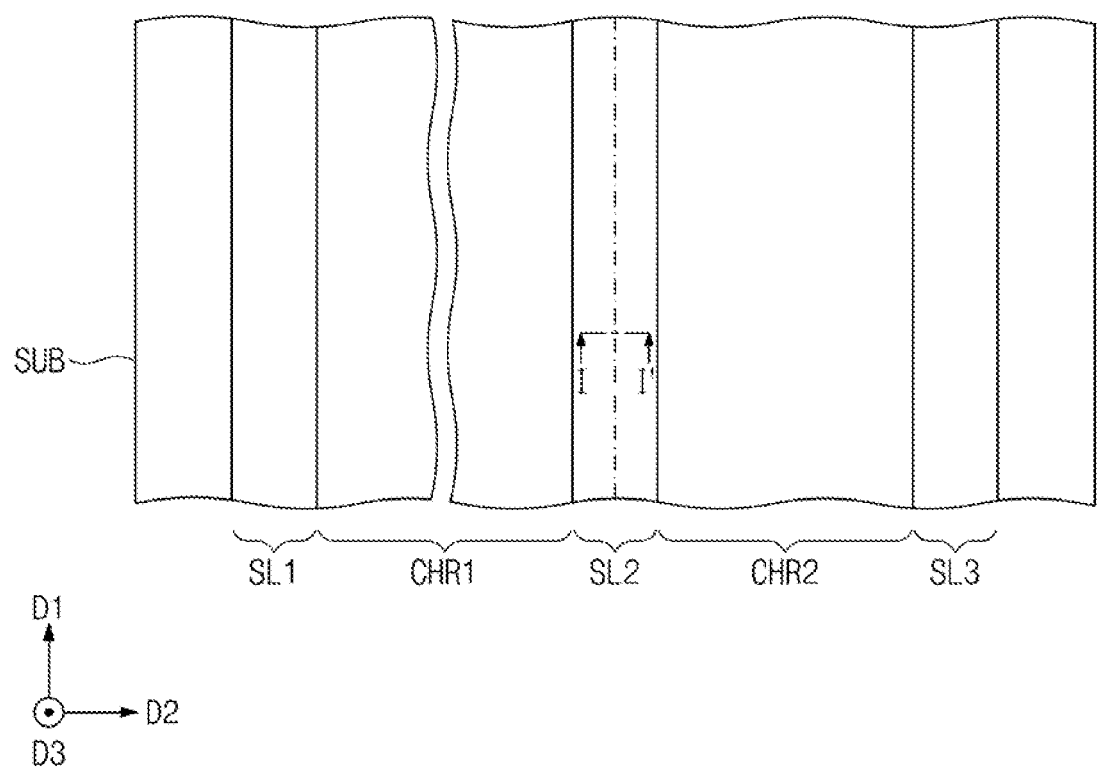
FIGS. 5, 7, 9 and 11 are schematic views of stages in an exposure process performed on a substrate by using a reflective mask according to some embodiments.
Figure 6:
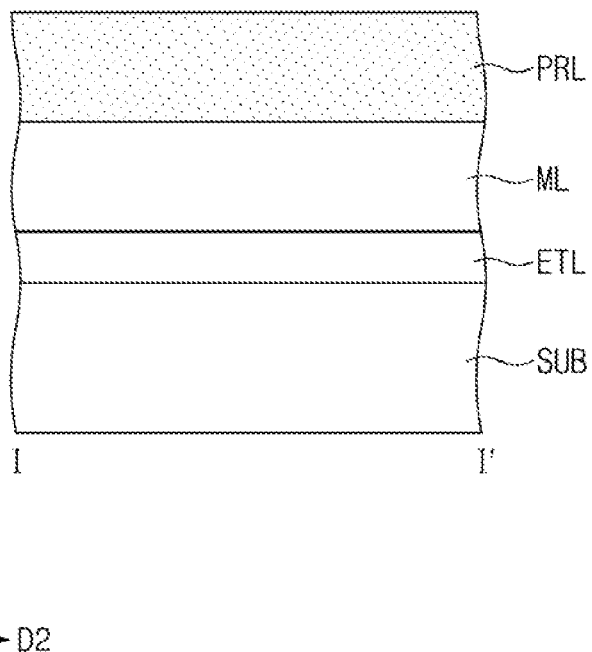
FIG. 6 is a cross-sectional view taken along line I-I' of FIG. 5.
Figure 7:
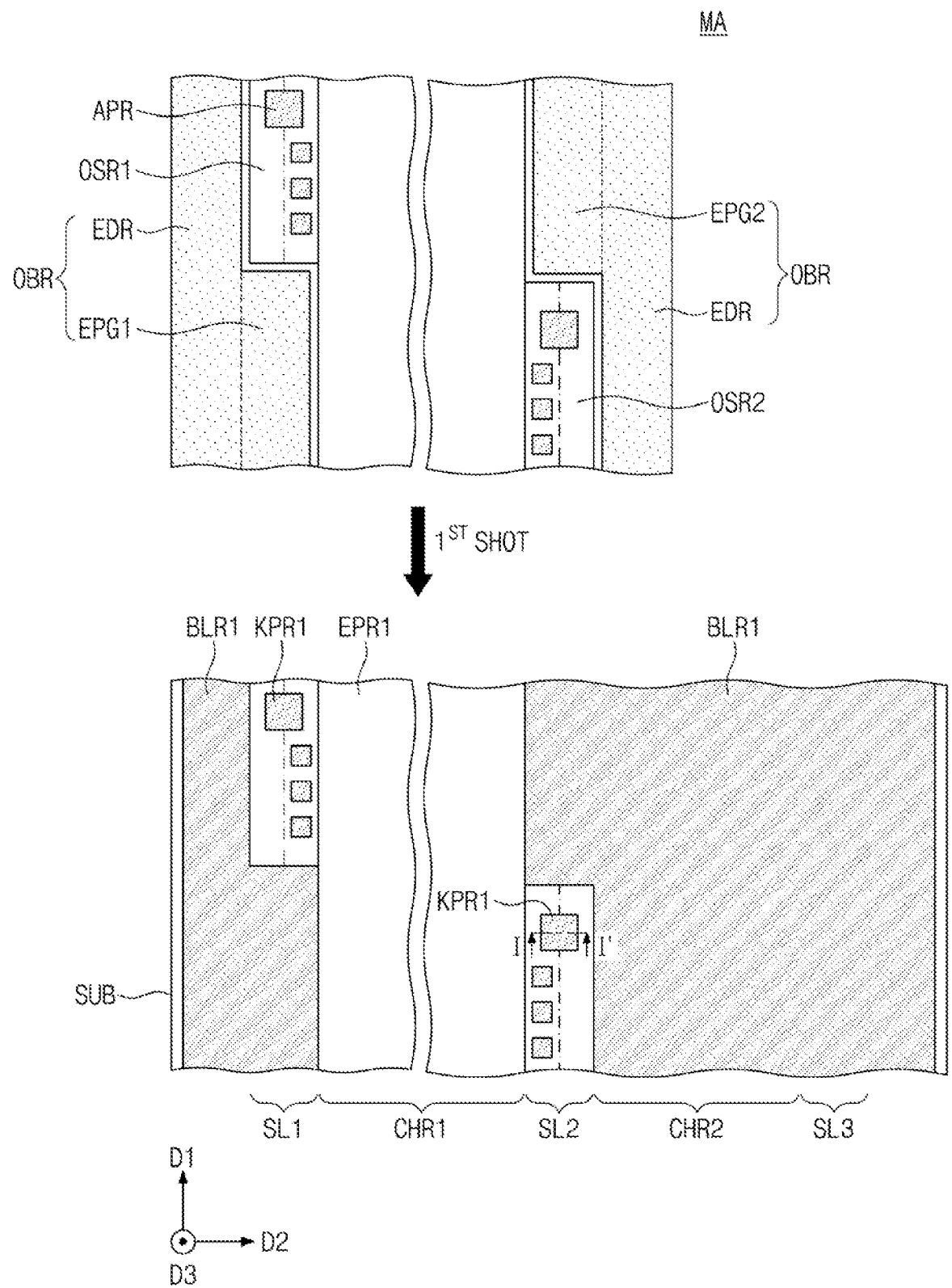

FIGS. 5, 7, 9 and 11 are schematic views illustrating an exposure process performed on the substrate SUB by using the reflective mask MA according to some embodiments. FIG. 6 is a cross-sectional view taken along line I-I' of FIG. 5, FIG. 8 is a cross-sectional view taken along line I-I' of FIG. 7, and FIG. 10 is a cross-sectional view taken along lines I-I' and II-II" of FIG. 9.

Referring to FIGS. 5 and 6, an etch target layer ETL, a hard mask layer ML, and a photoresist layer PRL may be sequentially formed on the substrate SUB, e.g., stacked along the D3 direction. For example, the etch target layer ETL, the hard mask layer ML, and the photoresist layer PRL may be continuous on the substrate SUB.

For example, the substrate SUB may include a first scribe line region SL1, a first chip region CHR1, a second scribe line region SL2, a second chip region CHR2, and a third scribe line region SL3. The first chip region CHR1 may be disposed between the first scribe line region SL1 and the second scribe line region SL2, and the second chip region CHR2 may be disposed between the second scribe line region SL2 and the third scribe line region SL3.

Figure 8:
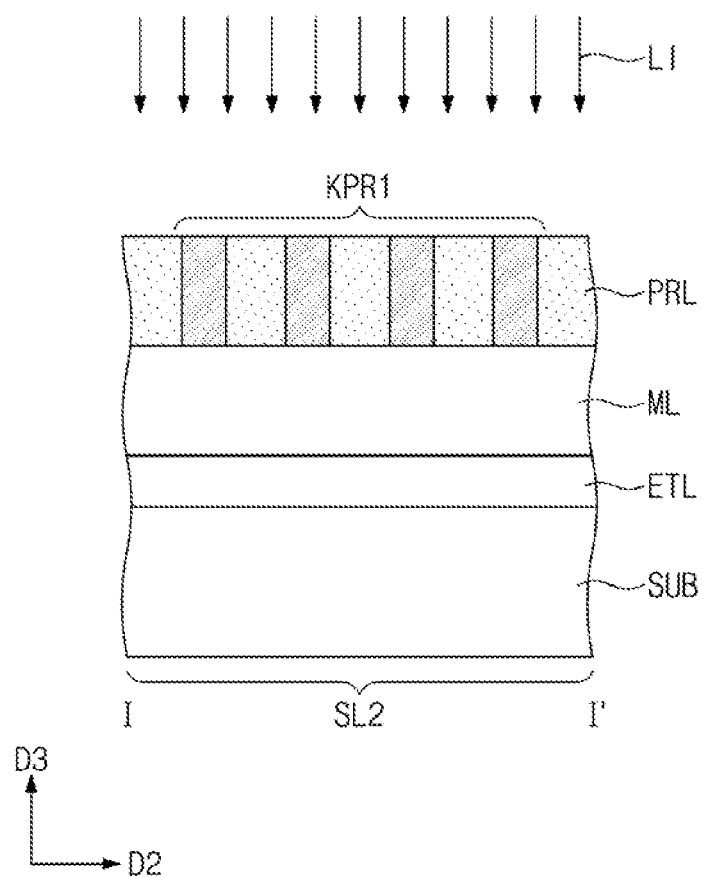
FIG. 8 is a cross-sectional view taken along line I-I' of FIG. 7.

Referring to FIGS. 7 and 8, a first exposure process may be performed on the substrate SUB by using the EUV exposure apparatus described above with reference to FIG. 1. For example, the reflective mask MA of FIGS. 3 and 4 may be loaded on the mask stage 32 of FIG. 1, and may be used to reflect light and perform exposure on the substrate SUB of FIG. 1, e.g., the view of the reflective mask MA in FIG. 7 faces the projector 40 in FIG. 1. The reflective mask MA described above with reference to FIGS. 3 and 4 may be used as an EUV mask.

A first shot may be applied onto the first scribe line region SL1, the first chip region CHR1, and the second scribe line region SL2 of the substrate SUB through the first exposure process. In other words, the photoresist layer PRL on the first scribe line region SL1, the first chip region CHR1, and the second scribe line region SL2 may be exposed by the first exposure process. For example, after the first shot, the photoresist layer PRL on the first scribe line region SL1, the first chip region CHR1, and the second scribe line region SL2 on the substrate SUB (bottom illustration of FIG. 7) may correspond to the various regions of the reflective mask MA (top illustration of FIG. 7), e.g., correspondence between the reflective mask MA to specific areas on the substrate SUB may be achieved by adjusting the reflective projection optics 42 in the projector 40 of FIG. 1 and moving the substrate SUB and/or the reflective mask MA.

In detail, as illustrated in FIG. 7, a first exposure region EPR1 (on which light LI is incident) and a first blocking region BLR1 (on which the light LI is not incident) may be defined on the substrate SUB in the first exposure process. The first blocking region BLR1 adjacent to the first exposure region EPR1 may correspond to the out-of-band region OBR of the reflective mask MA.

A portion of the first scribe line region SL1 may be the first exposure region EPR1 defined by the first outer auxiliary region OSR1, and another portion of the first scribe line region SL1 may be the first blocking region BLR1 defined by the first expansion region EPG1. A first pattern region KPR1 may be formed in the first exposure region EPR1 of the first scribe line region SL1 of the substrate SUB by the auxiliary pattern region APR. For example, the first pattern region KPR1 may include a key pattern, a guard ring pattern, or a chemical mechanical polishing (CMP) dummy pattern.

A portion of the second scribe line region SL2 may be the first exposure region EPR1 defined by the second outer auxiliary region OSR2, and another portion of the second scribe line region SL2 may be the first blocking region BLR1 defined by the second expansion region EPG2. A first pattern region KPR1 may be formed in the first exposure region EPR1 of the second scribe line region SL2 of the substrate SUB by the auxiliary pattern region APR.

Figure 9:
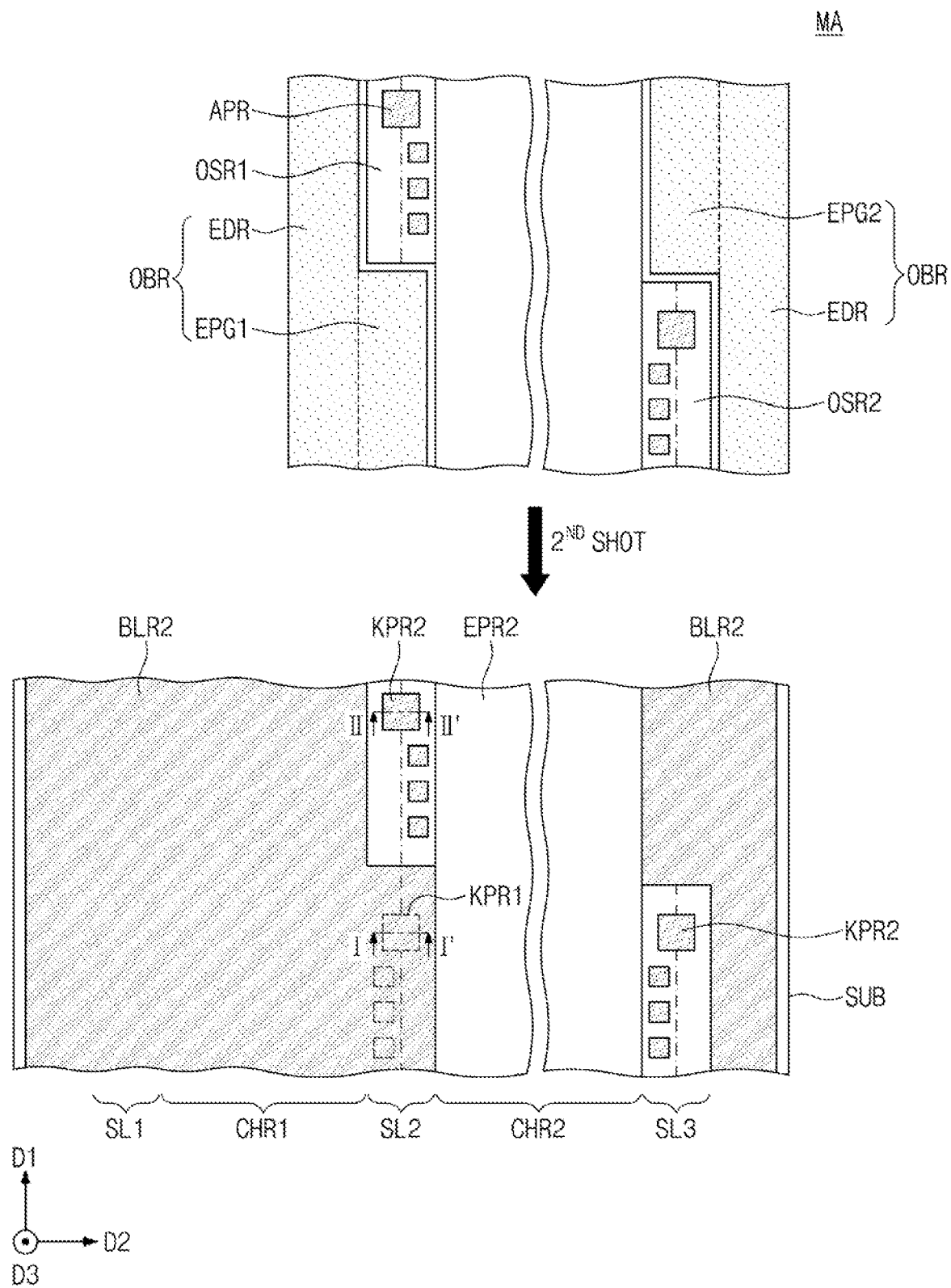
Figure 10:
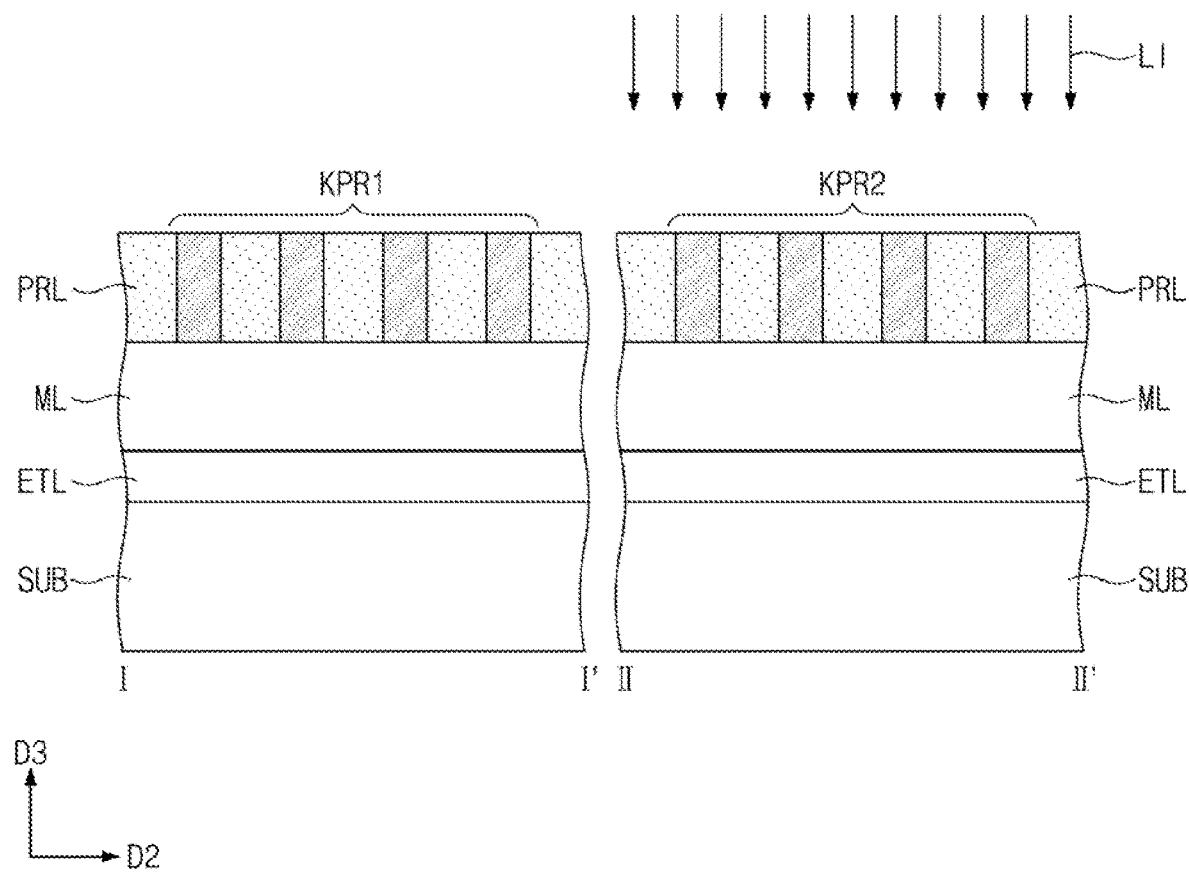
FIG. 10 is a cross-sectional view taken along lines I-I' and II-II" of FIG. 9.

Referring to FIGS. 9 and 10, after moving the substrate SUB and/or the reflective mask MA, a second exposure process may be performed. A second shot may be applied onto the second scribe line region SL2, the second chip region CHR2, and the third scribe line region SL3 of the substrate SUB through the second exposure process. A second exposure region EPR2 (on which light LI is incident) and a second blocking region BLR2 (on which the light LI is not incident) may be defined on the substrate SUB in the second exposure process.

A portion of the second scribe line region SL2 may be the second exposure region EPR2 defined by the first outer auxiliary region OSR1, and another portion of the second scribe line region SL2 may be the second blocking region BLR2 defined by the first expansion region EPG1. A second pattern region KPR2 may be formed in the second exposure region EPR2 of the second scribe line region SL2 of the substrate SUB by the auxiliary pattern region APR. For example, the second pattern region KPR2 may include a key pattern, a guard ring pattern, or a CMP dummy pattern.

A portion of the third scribe line region SL3 may be the second exposure region EPR2 defined by the second outer auxiliary region OSR2, and another portion of the third scribe line region SL3 may be the second blocking region BLR2 defined by the second expansion region EPG2. A second pattern region KPR2 may be formed in the second exposure region EPR2 of the third scribe line region SL3 of the substrate SUB by the auxiliary pattern region APR.

Meanwhile, the second exposure region EPR2 of the second exposure process may not overlap with the first exposure region EPR1 of the first exposure process of FIG. 7. In other words, the first exposure region EPR1 and the second exposure region EPR2 may be engaged with each other but may not overlap with each other (in a top view).

The first pattern region KPR1 formed on the second scribe line region SL2 by the first exposure process may overlap with the second blocking region BLR2 in the second exposure process (in a top view). In other words, the light LI may not be incident on the first pattern region KPR1 at all during the second exposure process, e.g., as the second blocking region BLR2 may cover the first pattern region KPR1 during the second exposed process. That is, the first pattern region KPR1 exposed previously may not be affected by the second exposure process.

Figure 11:
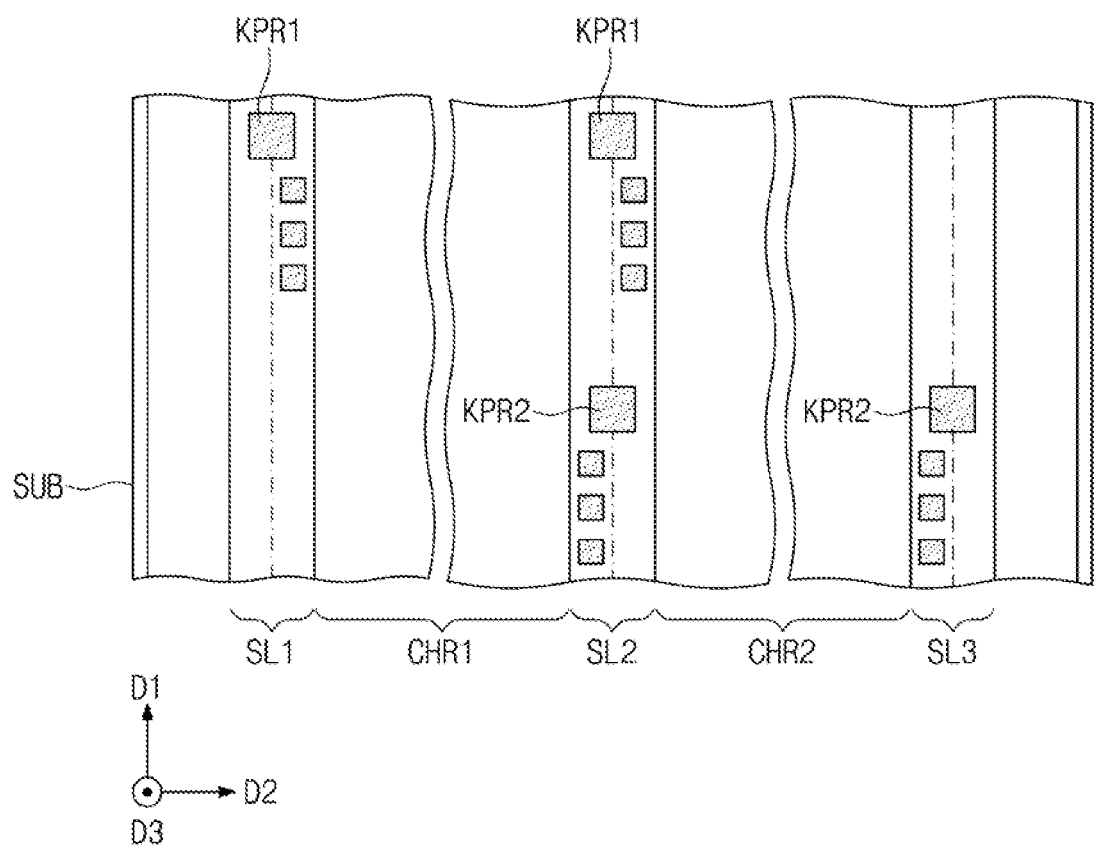

Referring to FIG. 11, the first pattern region KPR1 formed through the first exposure process and the second pattern region KPR2 formed through the second exposure process may both be provided on the second scribe line region SL2 of the substrate SUB.

Figure 12:
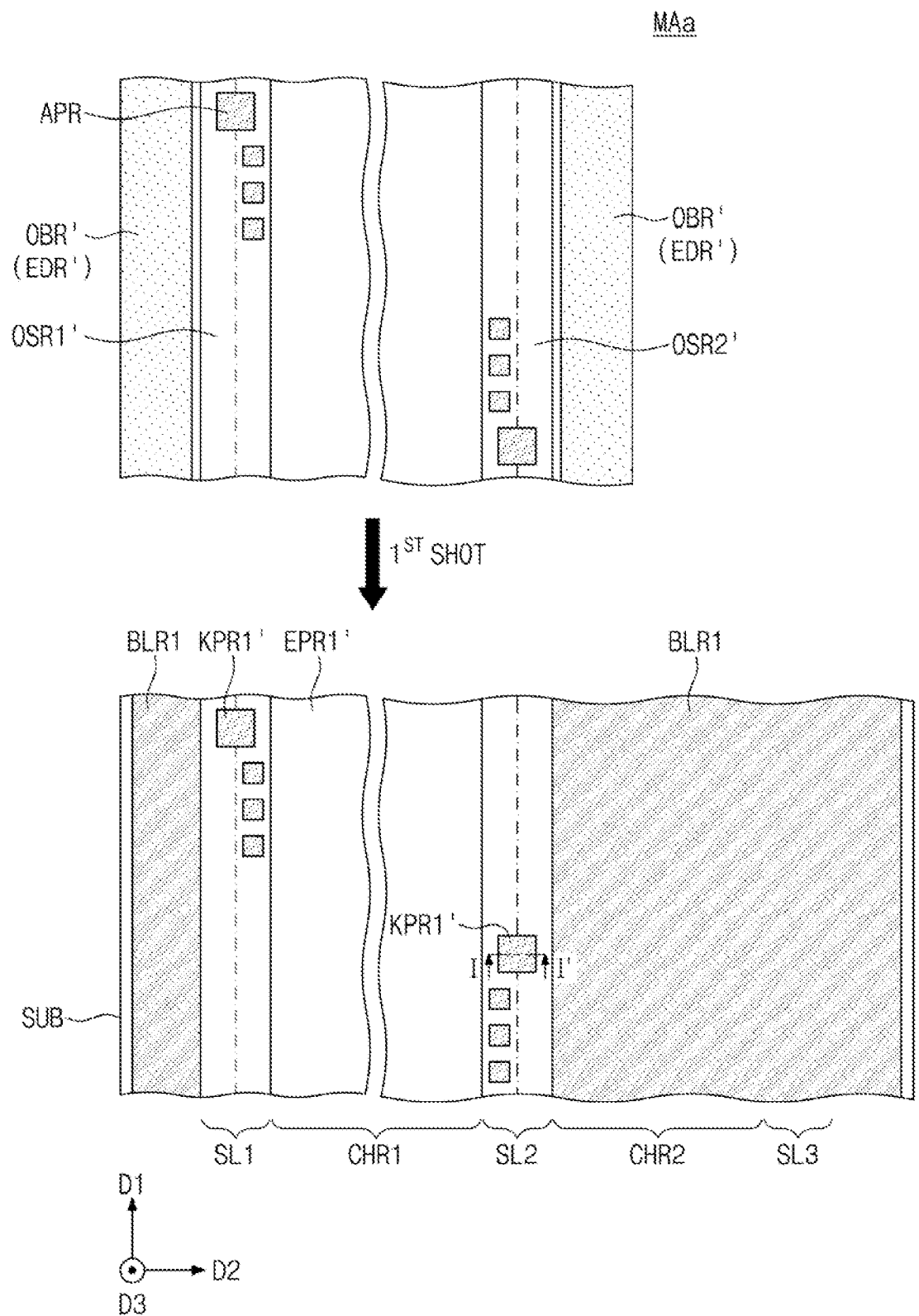
FIGS. 12 and 14 are schematic views of stages in an exposure process performed on a substrate by using a reflective mask according to a comparative example.
Figure 13:
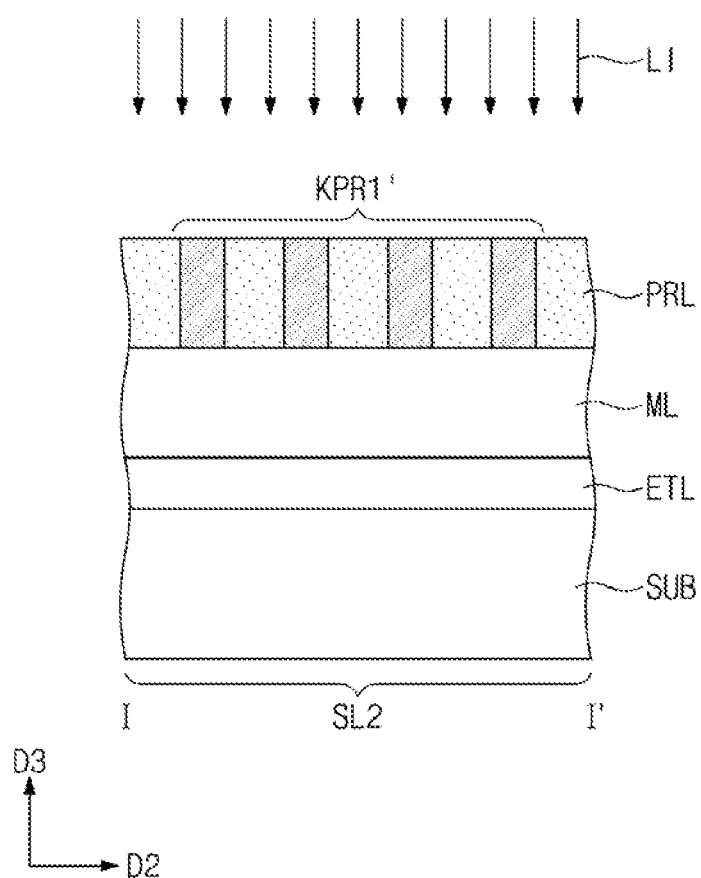
FIG. 13 is a cross-sectional view taken along line I-I' of FIG. 12.
Figure 14:
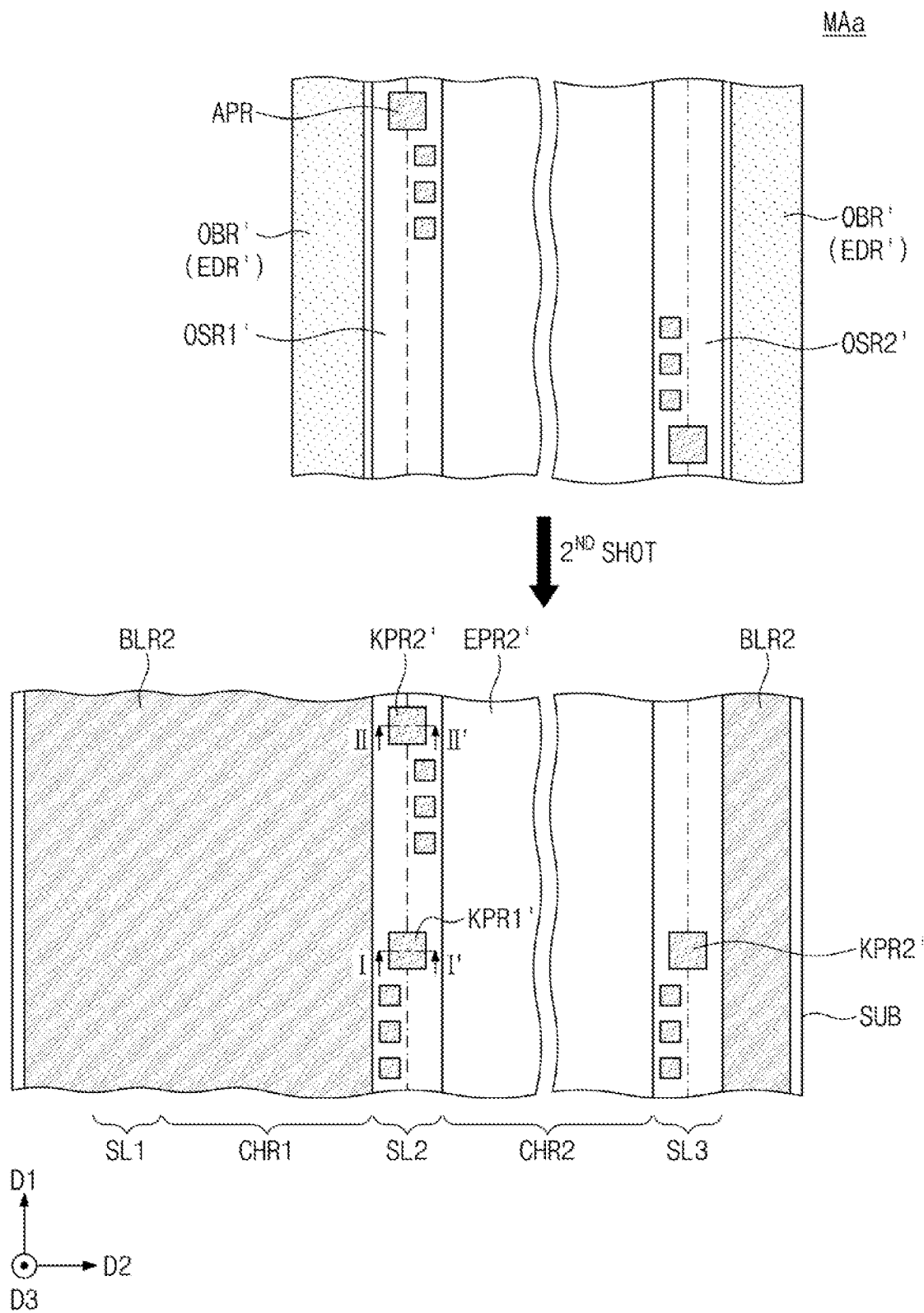
Figure 15:
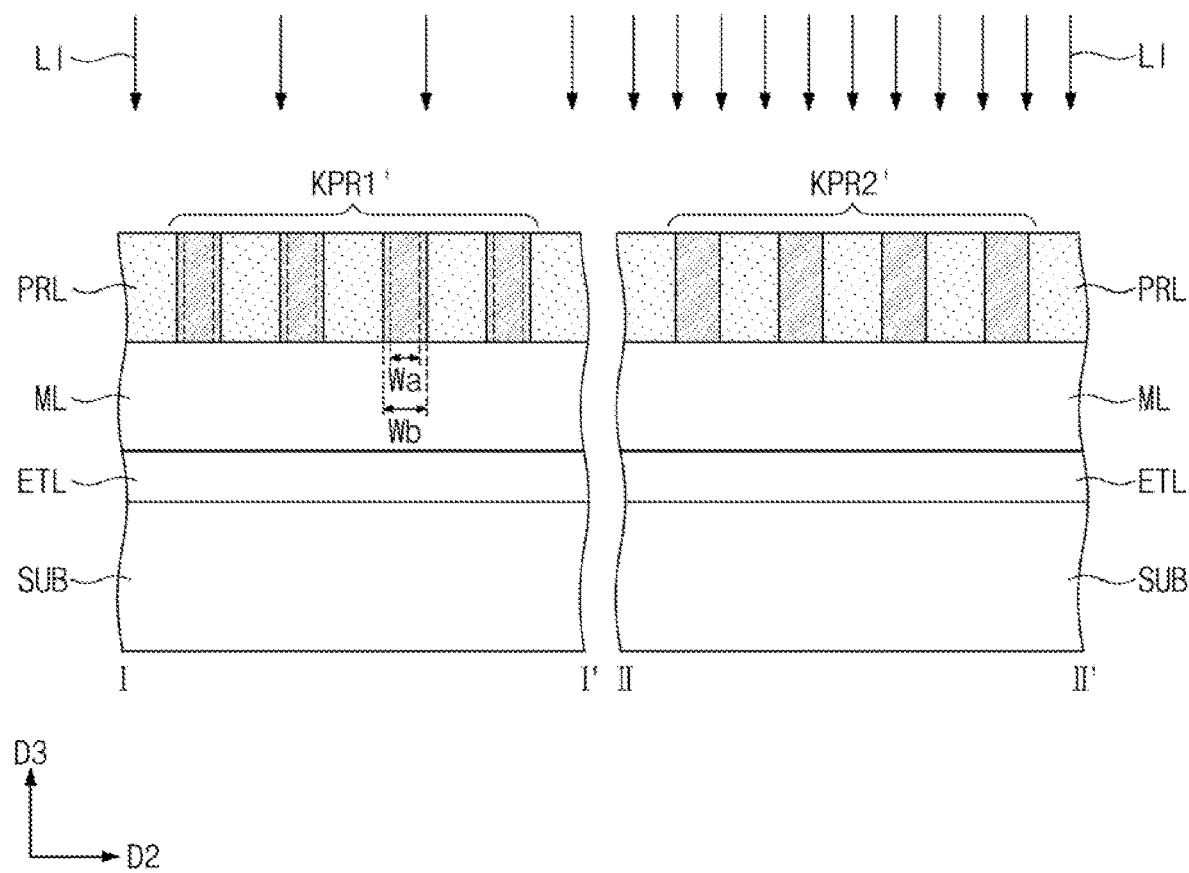
FIG. 15 is a cross-sectional view taken along lines I-I' and II-II" of FIG. 14.

FIGS. 12 and 14 are schematic views illustrating an exposure process performed on a substrate by using a reflective mask according to a comparative example. FIG. 13 is a cross-sectional view taken along line I-I' of FIG. 12, and FIG. 15 is a cross-sectional view taken along lines I-I' and II-II" of FIG. 14.

Referring to FIGS. 12 and 13, if a comparative reflective mask MAa did not have the first and second expansion regions, i.e., if the comparative reflective mask MAa were to have a completely linear out-of-band region OBR' corresponding only to an edge region EDR' without expansion regions, each of first and second outer auxiliary regions OSR1' and OSR2' of the reflective mask MAa would have had a linear line shape extending in one direction along an entire length of the linear edge region EDR'. As such, when a first exposure process would have been performed with such a reflective mask Maa on comparable portions of a substrate, the first exposure region EPR1' would have overlapped with the whole of the first and second scribe line regions SL1 and SL2, and the first pattern region KPR1' would have been formed on each of the first and second scribe line regions SL1 and SL2. Similarly, referring to FIGS. 14 and 15, when a second exposure process would have been performed with such a reflective mask Maa on comparable portions of a substrate, the second exposure region EPR2' would have overlapped with the whole of the second and third scribe line regions SL2 and SL3, and the second pattern region KPR2' would have been formed on each of the second and third scribe line regions SL2 and SL3.

However, as seen in FIG. 14, the second exposure region EPR2' would have partially overlapped with the first exposure region EPR1'. For example, the second exposure region EPR2' would have overlapped with the first pattern region KPR1' of the second scribe line region SL2. In other words, the light LI by the second exposure process would have been incident on the first pattern region KPR1' exposed previously by the first exposure process. However, as the light LI incident on the first pattern region KPR1' in the second exposure process may be EUV light and/or DUV light, which is not absorbed in the absorption layer ABL of the reflective mask MAa, undesirable light reflection could have occurred in the reflective mask MAa.

A width of a pattern of the first pattern region KPR1' would have been changed by the light LI incident on the first pattern region KPR1' in the second exposure process. For example, the width of the pattern of the first pattern region KPR1' would have been increased by the light LI incident on the first pattern region KPR1'. A width Wa of the pattern of the first pattern region KPR1' before the second exposure process would have been less than a width Wb of the pattern of the first pattern region KPR1' after the second exposure process. For example, a change amount (Wb-Wa) of the width of the pattern of the first pattern region KPR1' would have ranged from about 1 nm to about 10 nm.

The pattern of the first pattern region KPR1' could have been used as a key pattern in a subsequent process. However, if the width of the pattern of the first pattern region KPR1' were to be changed as described, process failure could have occurred in the subsequent process.

In contrast, according to embodiments, the reflective mask MA is designed in such a way that the first exposure region EPR1 and the second exposure region EPR2 do not overlap with each other (in a top view), as discussed in detail with reference to FIGS. 5 to 11. Thus, it is possible to prevent the width of the pattern of the first pattern region KPR1 from being changed. As a result, according to embodiments, reliability of a semiconductor device may be improved.

Figure 16:
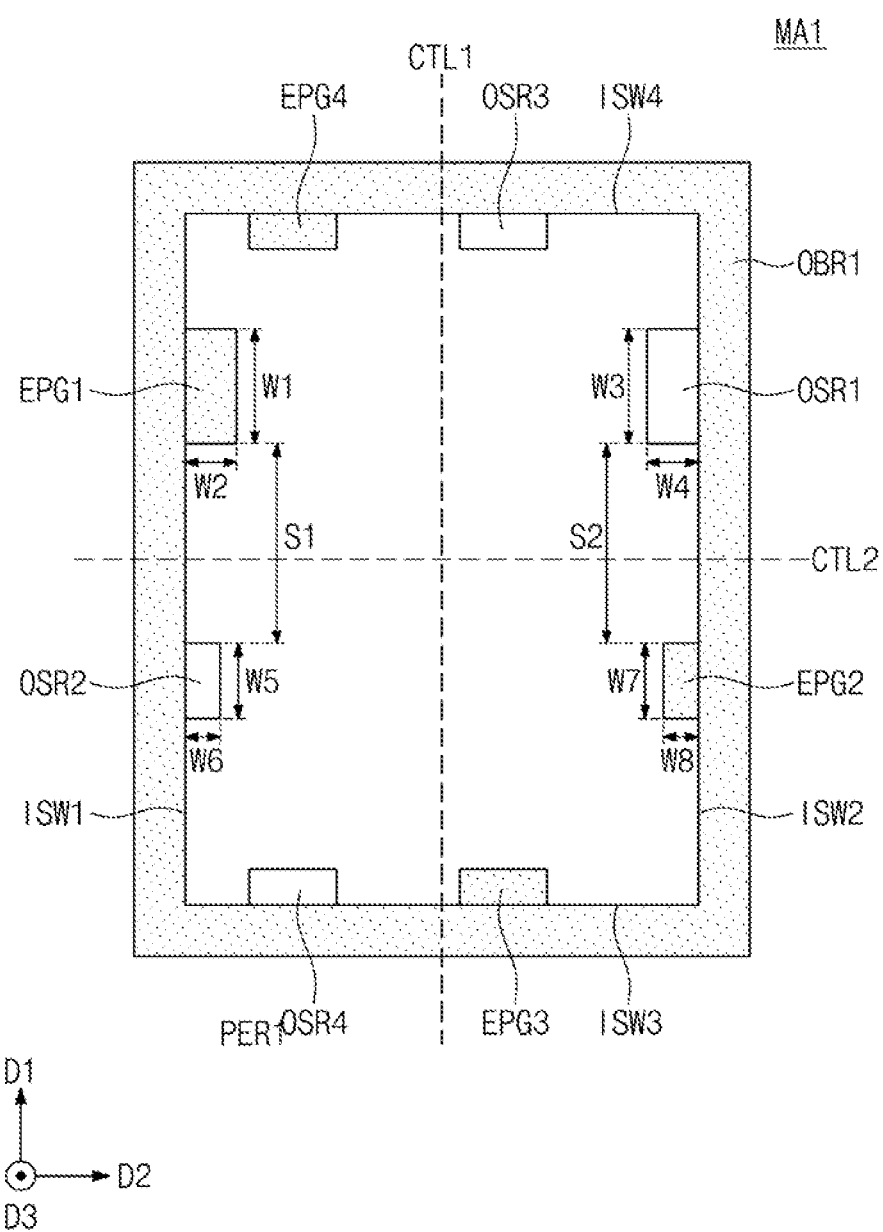
FIG. 16 is a plan view of a reflective mask according to some embodiments.

FIG. 16 is a plan view schematically illustrating a reflective mask according to some embodiments. Referring to FIG. 16, a reflective mask MA1 may include an out-of-band region OBR1 on its border or edge. An inner sidewall of the out-of-band region OBR1 may include a first inner sidewall ISW1, a second inner sidewall ISW2, a third inner sidewall ISW3, and a fourth inner sidewall ISW4. The first inner sidewall ISW1 and the second inner sidewall ISW2 may be opposite to each other in a second direction D2. The third inner sidewall ISW3 and the fourth inner sidewall ISW4 may be opposite to each other in the first direction D1. The first to fourth inner sidewalls ISW1 to ISW4 may be connected to each other to constitute a rectangular or square shape.

The first expansion region EPG1 and the second outer auxiliary region OSR2 may be disposed on the first inner sidewall ISW1. The first outer auxiliary region OSR1 and the second expansion region EPG2 may be disposed on the second inner sidewall ISW2. The first center line CTL1 passing through a center of the reflective mask MA1 and extending in the first direction D1 may be defined. The first expansion region EPG1 and the first outer auxiliary region OSR1 may be symmetrical with respect to the first center line CTL1, and the second outer auxiliary region OSR2 and the second expansion region EPG2 may be symmetrical with respect to the first center line CTL1.

The first expansion region EPG1 may have a first width W1 in the first direction D1 and a second width W2 in the second direction D2. The first outer auxiliary region OSR1 may have a third width W3 in the first direction D1 and a fourth width W4 in the second direction D2. The first width W1 and the third width W3 may be equal to each other, and the second width W2 and the fourth width W4 may be equal to each other.

The second outer auxiliary region OSR2 may have a fifth width W5 in the first direction D1 and a sixth width W6 in the second direction D2. The second expansion region EPG2 may have a seventh width W7 in the first direction D1 and an eighth width W8 in the second direction D2. The fifth width W5 and the seventh width W7 may be equal to each other, and the sixth width W6 and the eighth width W8 may be equal to each other.

In some embodiments, the first width W1 and the seventh width W7 may be different from each other. The second width W2 and the eighth width W8 may be different from each other. In other words, the first expansion region EPG1 and the second expansion region EPG2 may have different sizes from each other. The third width W3 and the fifth width W5 may be different from each other. The fourth width W4 and the sixth width W6 may be different from each other. In other words, the first outer auxiliary region OSR1 and the second outer auxiliary region OSR2 may have different sizes from each other.

A distance between the first expansion region EPG1 and the second outer auxiliary region OSR2 may be a first distance S1, and a distance between the first outer auxiliary region OSR1 and the second expansion region EPG2 may be a second distance S2. The first distance S1 and the second distance S2 may be equal to each other.

A third expansion region EPG3 and a fourth outer auxiliary region OSR4 may be disposed on the third inner sidewall ISW3. A third outer auxiliary region OSR3 and a fourth expansion region EPG4 may be disposed on the fourth inner sidewall ISW4. A second center line CTL2 passing through the center of the reflective mask MA1 and extending in the second direction D2 may be defined. The second center line CTL2 may be perpendicular to the first center line CTL1. The third expansion region EPG3 and the third outer auxiliary region OSR3 may be symmetrical with respect to the second center line CTL2, and the fourth outer auxiliary region OSR4 and the fourth expansion region EPG4 may be symmetrical with respect to the second center line CTL2.

Figure 17:
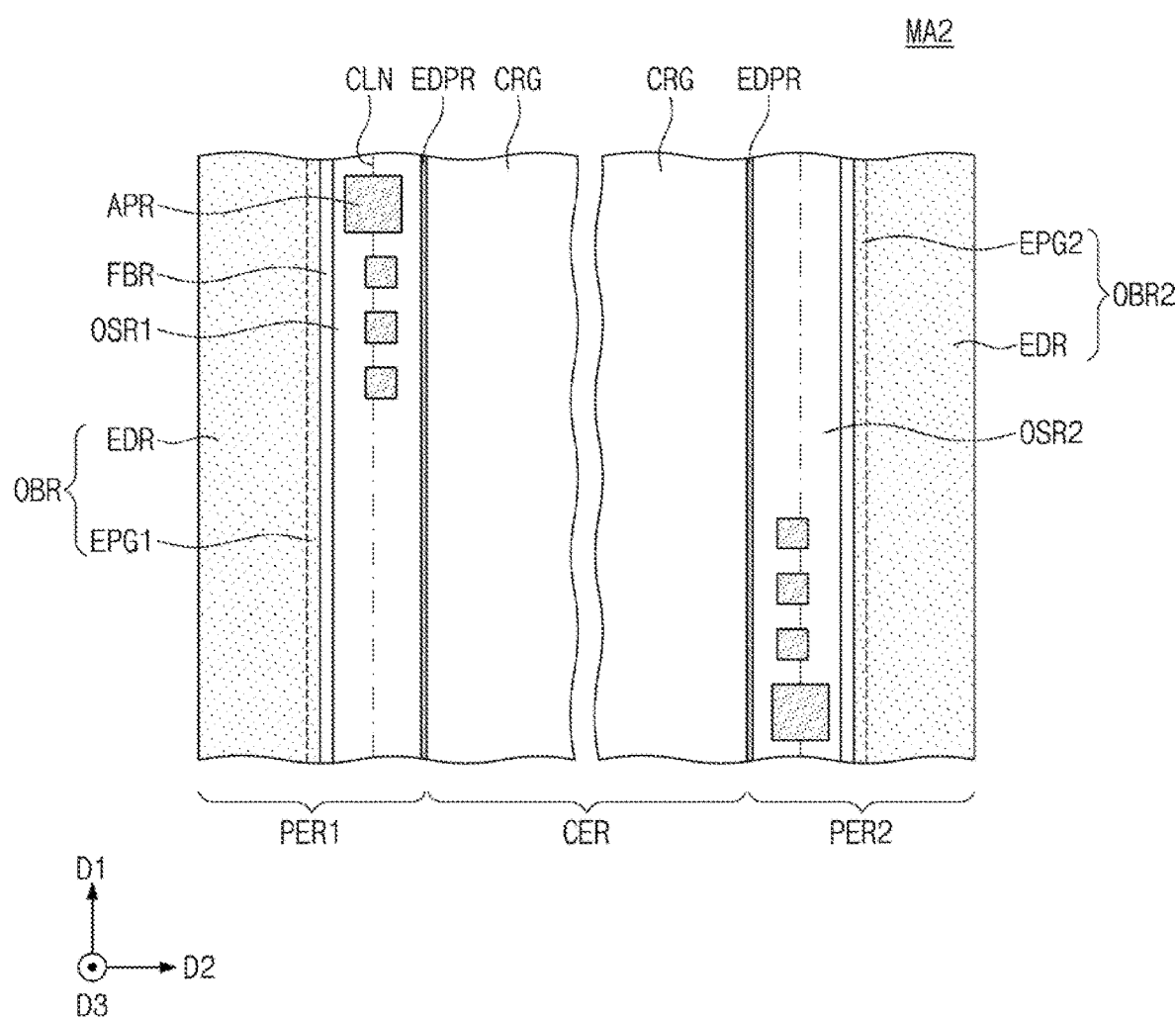
FIG. 17 is a plan view of a reflective mask according to some embodiments.

FIG. 17 is a plan view schematically illustrating a reflective mask according to some embodiments. Referring to FIG. 17, a reflective mask MA2 may include edge pattern regions EDPR which are disposed on a boundary between the first outer auxiliary region OSR1 and the central region CER, and a boundary between the second outer auxiliary region OSR2 and the central region CER, respectively. The edge pattern region EDPR may have a line shape extending in the first direction D1.

For example, the edge pattern region EDPR may transfer or project a guard ring pattern between a scribe line region and a chip region of a substrate. A width of the guard ring pattern formed on a wafer may range from about 100 nm to about 500 nm.

Each of first and second expansion regions EPG1 and EPG2 may have the same shape as the edge pattern region EDPR, i.e., a line shape extending in the first direction D1. For example, in the second exposure process described above with reference to FIGS. 9 and 10, the first expansion region EPG1 may define a blocking region for preventing the guard ring pattern formed by the first exposure process from being exposed.

In the present embodiments, a width of a key pattern transferred on the substrate by the auxiliary pattern region APR may be greater than about 1000 nm. Thus, even if the width of a key pattern were to be changed (e.g., as described above with reference to FIGS. 13 and 14), the change amount would be relatively small, e.g., negligible. Thus, the possibility of occurrence of process failure may be low. However, if the width change described above with reference to FIGS. 13 and 14 were to occur at a pattern having a relatively small width (e.g., the guard ring pattern), the change amount would be relatively large. Process failure of the pattern having the fine width may occur by a slight change in width.

In contrast, according to embodiments, the expansion region of an out-of-band region OBR2 may be appropriately disposed in the reflective mask MA2 to block a pattern defining a fine width. Thus, process failure caused in a subsequent exposure process may be prevented.

Figure 18:
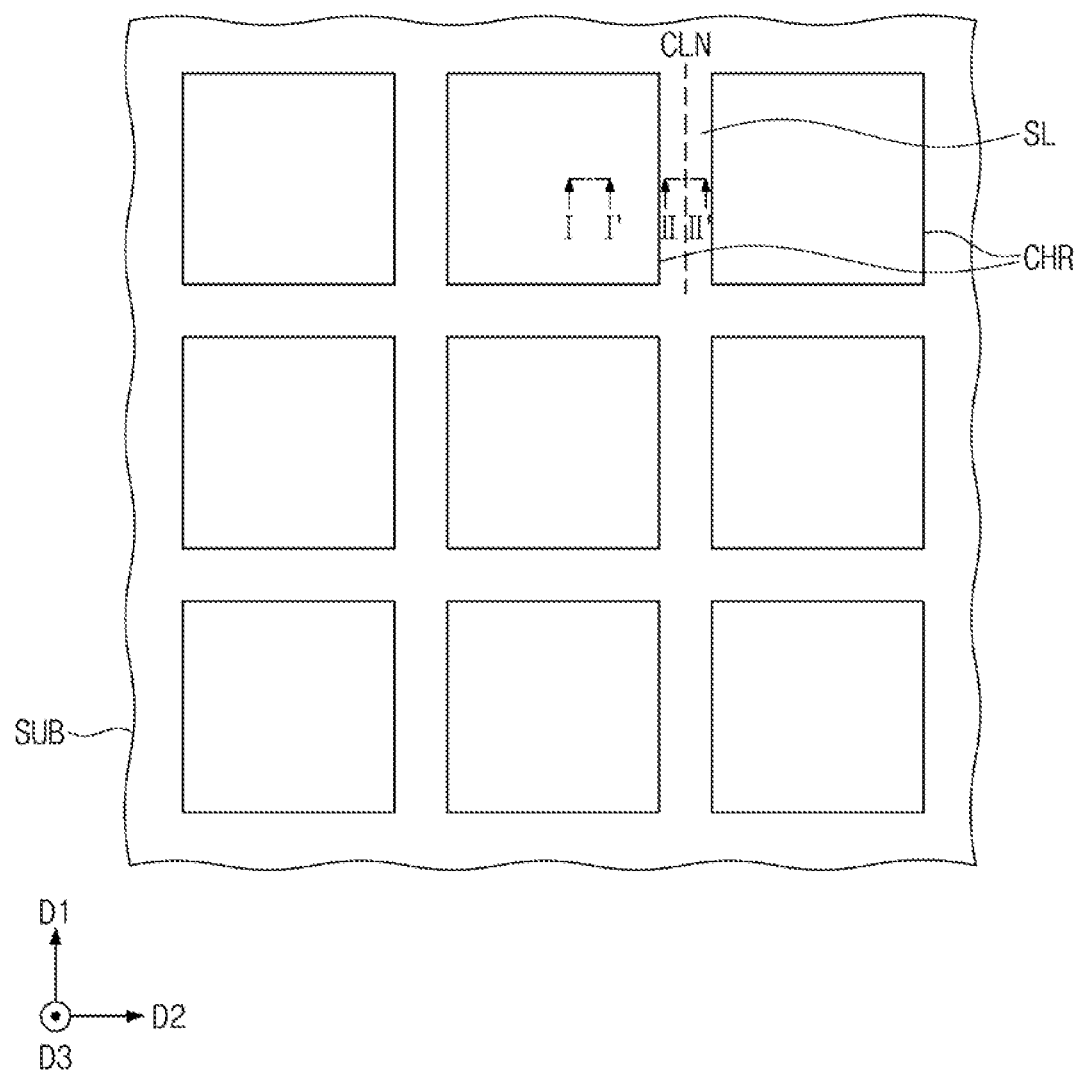
FIGS. 18 to 22 are views illustrating stages in a method for manufacturing a semiconductor device according to some embodiments.

FIGS. 18 to 22 are views illustrating stages in a method for manufacturing a semiconductor device, according to some embodiments. In detail, FIG. 18 is a plan view schematically illustrating a substrate (i.e., a wafer), and FIGS. 19 to 22 are cross-sectional views taken along lines I-I' and II-II" of FIG. 18.

Referring to FIG. 18, the substrate SUB may include a plurality of chip regions CHR two-dimensionally arranged and a scribe line region SL between the chip regions CHR. After semiconductor processes are completed, the chip regions CHR may be separated from each other as dies by cutting the scribe line region SL. Hereinafter, a process for manufacturing a dynamic random access memory (DRAM) device of semiconductor devices will be described as an example.

Figure 19:
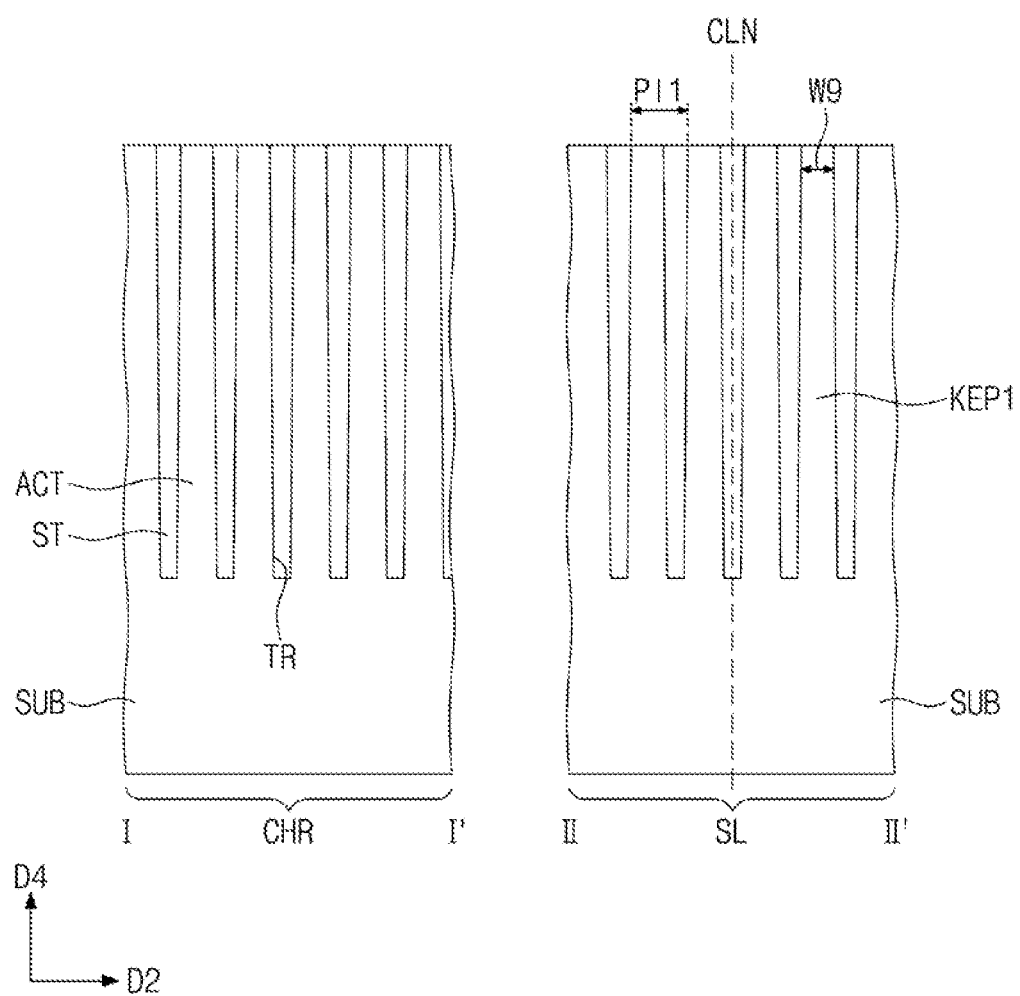

Referring to FIGS. 18 and 19, an upper portion of the substrate SUB may be patterned to form active patterns ACT on the chip region CHR. A trench TR may be defined between the active patterns ACT. A device isolation layer ST filling the trench TR may be formed.

According to some embodiments, the patterning process for forming the active patterns ACT may include a lithography process using EUV light. The lithography process using the EUV light may include an exposure process using the EUV light irradiated onto a photoresist layer (see PRL of FIG. 6) and a development process. For example, the photoresist layer may include an organic photoresist containing an organic polymer, e.g., polyhydroxystyrene. The organic photoresist may further include a photosensitive compound capable of reacting to the EUV light. The organic photoresist may additionally include a material having a high absorption rate for the EUV light, e.g., an organometallic material, an iodine-containing material, or a fluorine-containing material. For other examples, the photoresist layer may include an inorganic photoresist containing an inorganic material, e.g., tin oxide.

The photoresist layer may be formed with a relatively thin thickness. The photoresist layer exposed to the EUV light may be developed to form photoresist patterns. The photoresist patterns may have, but not limited to, line shapes extending in one direction, island shapes, a zigzag form, a honeycomb form, or circular shapes when viewed in a plan view.

One or more hard mask layers (see ML of FIG. 6) stacked under the photoresist patterns may be patterned using the photoresist patterns as an etch mask to form mask patterns. A target layer (see ETL of FIG. 6) may be patterned using the mask patterns as an etch mask to form desired patterns on a wafer.

In a comparative example, a multi patterning technique (MPT) using two or more photomasks may be required to form patterns having a fine pitch on a wafer. On the contrary, when the EUV lithography process according to the embodiments is performed, the active patterns ACT having a fine pitch may be formed using a single photomask.

For example, a minimum pitch between the active patterns ACT realized by the EUV lithography process of the present embodiments may be about 45 nm or less. In other words, since the EUV lithography process is performed, the fine active patterns ACT may be realized without the multi patterning technique. Any of the reflective masks MA, MA1, and MA2 according to the aforementioned embodiments may be used as the photomask for forming the active patterns ACT.

While the active patterns ACT are formed using the EUV lithography process using any of the reflective masks MA, MA1, and MA2, the first key patterns KEP1 may be formed on the scribe line region SL through the auxiliary pattern region APR of the reflective mask MA. For example, the first key pattern KEP1 may also be formed on the center line CLN of the scribe line region SL. The first key patterns KEP1 may be continuously arranged at both sides of the center line CLN at a constant pitch PI1. Each of the first key patterns KEP1 may have a constant width W9.

Figure 20:
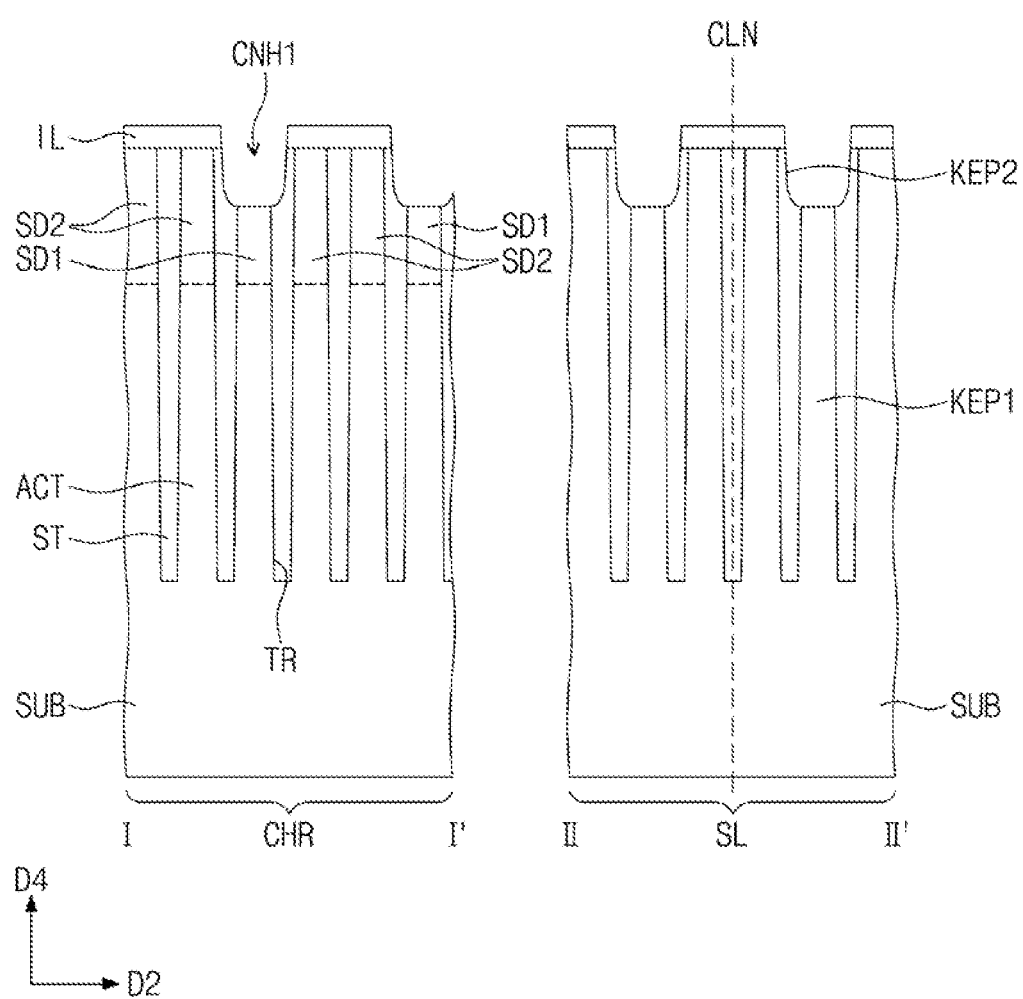

Referring to FIGS. 18 and 20, a plurality of buried gate electrodes intersecting the active patterns ACT may be formed on the chip region CHR. An ion implantation process may be performed on the active patterns ACT to form first and second source/drain regions SD1 and SD2 in an upper portion of each of the active patterns ACT. An insulating layer IL may be formed on an entire top surface of the substrate SUB. For example, the insulating layer IL may have a multi-layered structure in which a silicon oxide layer and a silicon oxynitride layer are stacked.

The insulating layer IL may be patterned to form first contact holes CNH1 exposing the first source/drain regions SD1 of the active patterns ACT, respectively. When the first contact hole CNH1 is formed, an upper portion of the first source/drain region SD1 may be recessed. When the first contact hole CNH1 is formed, an upper portion of the device isolation layer ST around the first source/drain region SD1 may also be recessed.

In some embodiments, the first contact holes CNH1 may be formed using the EUV lithography process described above. While the first contact holes CNH1 are formed using the EUV lithography process using any of the reflective masks MA, MA1, and MA2, the second key patterns KEP2 may be formed on the scribe line region SL through the auxiliary pattern region APR of the corresponding one of the reflective masks MA, MA1, and MA2. The second key pattern KEP2 may be formed in a hole shape. Like the first key patterns KEP1, the second key patterns KEP2 may be formed at both sides of the center line CLN to have a constant pitch and a constant width.

Figure 21:
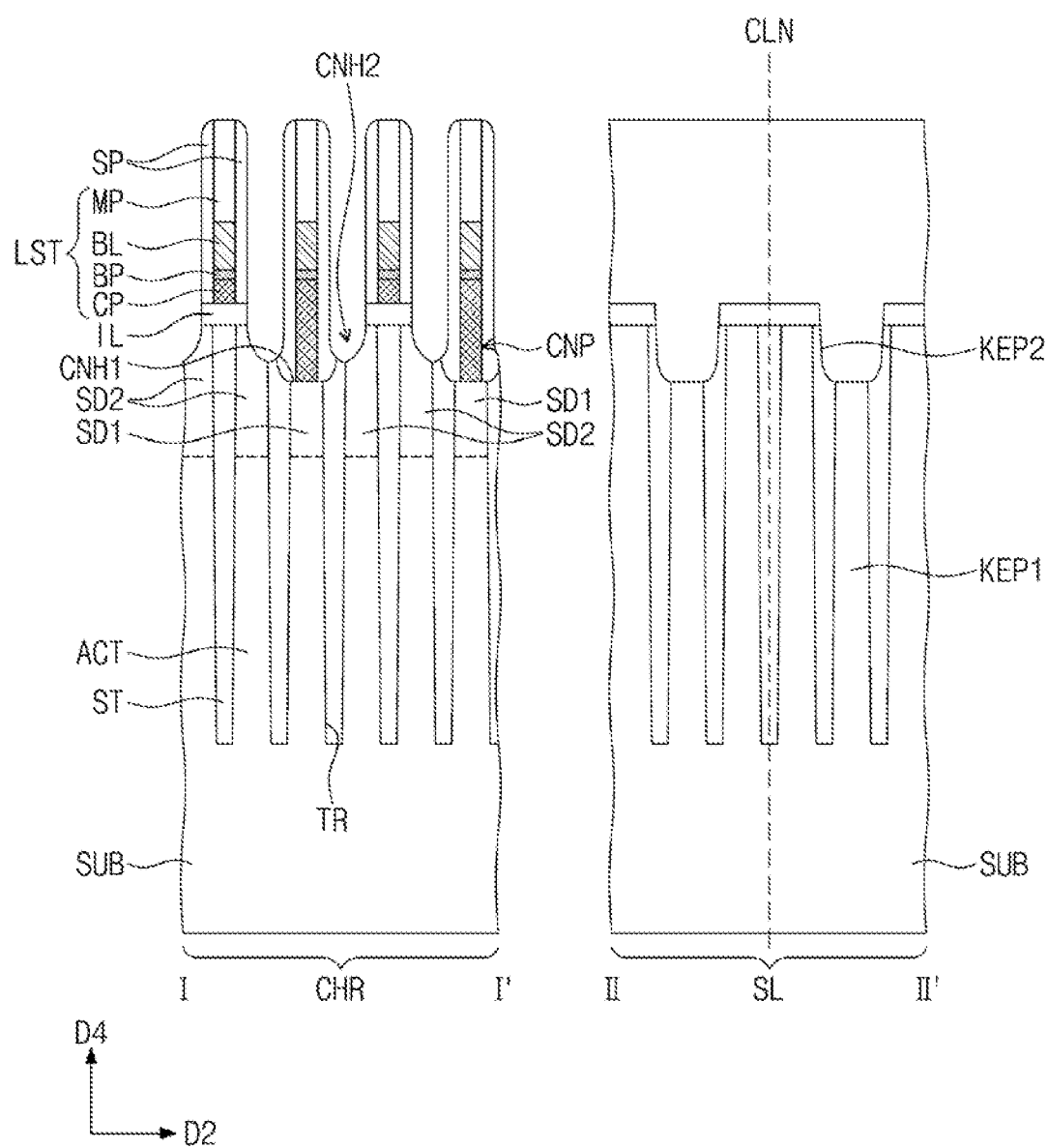

Referring to FIGS. 18 and 21, line structures LST extending in parallel to each other may be formed on the chip region CHR. Each of the line structures LST may include a conductive pattern CP, a barrier pattern BP, a bit line BL, and a mask pattern MP, which are sequentially stacked. The conductive pattern CP may include a contact portion CNP which fills the first contact hole CNH1 and is connected to the first source/drain region SD1. The contact portion CNP may be in direct contact with the first source/drain region SD1.

The barrier pattern BP may inhibit or prevent a metal material in the bit line BL from being diffused into the conductive pattern CP. The bit line BL may be electrically connected to the first source/drain region SD1 through the barrier pattern BP and the conductive pattern CP. The conductive pattern CP may include a doped semiconductor material (e.g., doped silicon, doped germanium, etc.). The barrier pattern BP may include a conductive metal nitride (e.g., titanium nitride or tantalum nitride). The bit line BL may include a metal material (e.g., titanium, tantalum, tungsten, copper, or aluminum).

A pair of spacers SP may be formed on both sidewalls of each of the line structures LST. Each of the spacers SP may include at least one of, e.g., a silicon oxide layer, a silicon nitride layer, or a silicon oxynitride layer.

An etching process may be performed on the substrate SUB by using the spacers SP and the mask patterns MP as etch masks, thereby forming second contact holes CNH2 exposing the second source/drain regions SD2, respectively. When the second contact hole CNH2 is formed, an upper portion of the second source/drain region SD2 may be recessed. In some embodiments, when the line structures LST, the spacers SP, and the second contact holes CNH2 are formed, the scribe line region SL may be protected by a mask layer.

Figure 22:
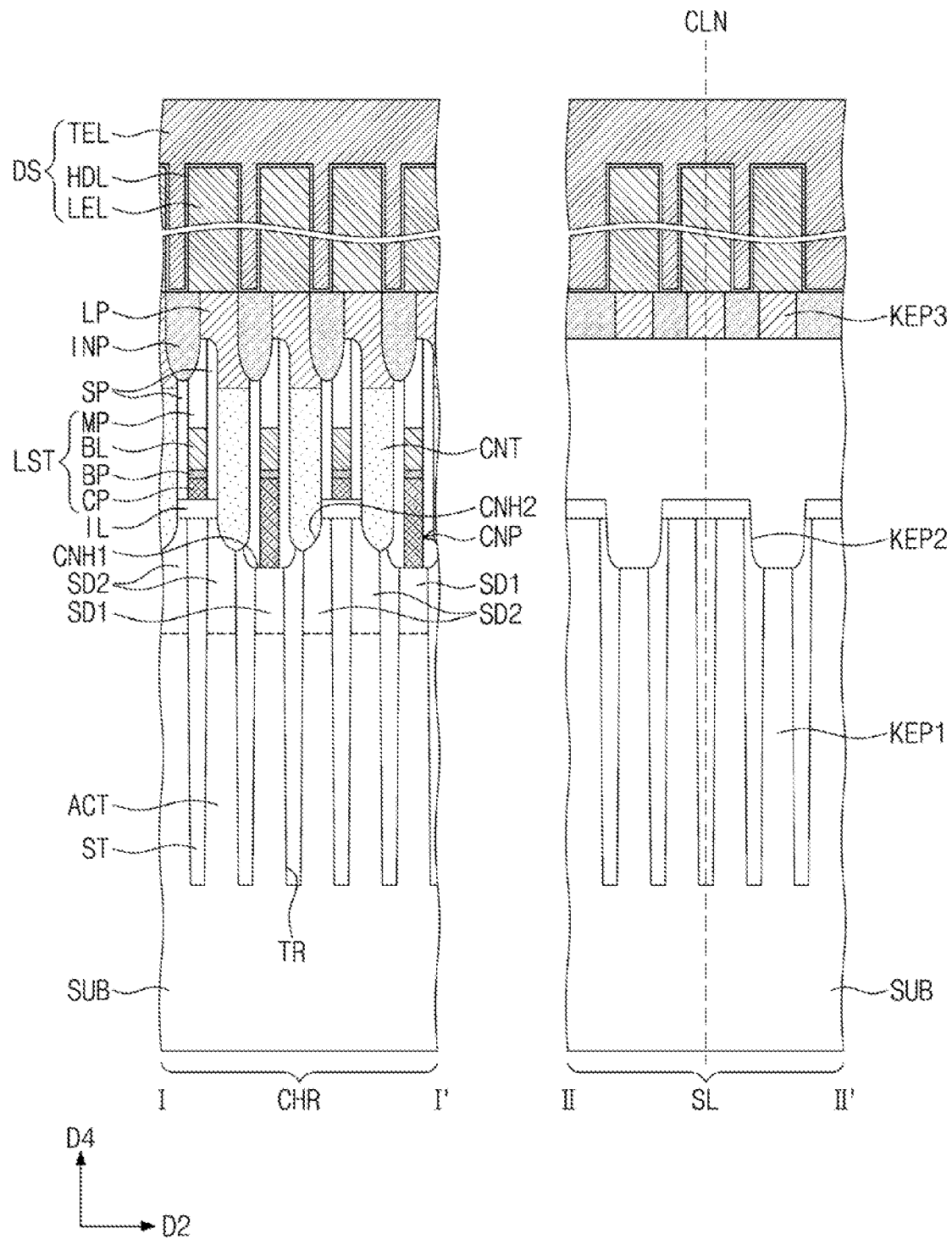

Referring to FIGS. 18 and 22, contacts CNT may be respectively formed in the second contact holes CNH2 by filling the second contact holes CNH2 on the chip region CHR with a conductive material. The contacts CNT may be connected to the second source/drain regions SD2. The conductive material filling the second contact holes CNH2 may include a doped semiconductor material.

Landing pads LP may be formed on the contacts CNT on the chip region CHR, respectively. For example, a metal layer may be formed on the contacts CNT and the line structures LST. A plurality of the landing pads LP may be formed by patterning the metal layer. An insulating pattern INP may be formed by filling a space between the plurality of landing pads LP with an insulating material.

In some embodiments, the patterning process for forming the landing pads LP may include the EUV lithography process described above. While the landing pads LP are formed using the EUV lithography process using any of the reflective masks MA, MA1, and MA2, third key patterns KEP3 may be formed on the scribe line region SL through the auxiliary pattern region APR of the reflective mask MA. The third key pattern KEP3 may be formed in an island shape. Like the first key patterns KEP1, the third key patterns KEP3 may be formed at both sides of the center line CLN to have a constant pitch and a constant width.

Subsequently, first electrodes LEL may be formed on the landing pads LP, respectively. A dielectric layer HDL may be conformally formed on the first electrodes LEL. A second electrode TEL may be formed on the dielectric layer HDL. The first electrode LEL, the dielectric layer HDL and the second electrode TEL may constitute a data storage element DS, e.g., a capacitor. Even though not shown in the drawings, stacked interconnection layers (e.g., M1, M2, M3, M4, . . . ) may be formed on the second electrode TEL.

The reflective mask according to embodiments may include the expansion region of the out-of-band region. The expansion region may be appropriately disposed to block a previously exposed pattern in an exposure process. Thus, it is possible to prevent process failure which may be caused in the exposure process, and the reliability of the semiconductor device may be improved.

By way of summation and review, embodiments provide a reflective mask capable of manufacturing a semiconductor device with improved reliability. Embodiments also provide a method for manufacturing a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reflective mask, comprising:
a central region; and
a first peripheral region and a second peripheral region at opposite sides of the central region, respectively,
wherein the first peripheral region includes:
a first out-of-band region having:
a first edge region extending in a first direction, and
a first expansion region between the first edge region and the central region, and
a first outer auxiliary region adjacent to the first expansion region of the first out-of-band region in the first direction, the first outer auxiliary region having a first auxiliary pattern region.

2. The reflective mask as claimed in claim 1, wherein:
the first peripheral region further includes a buffer region extending along one side of the first out-of-band region, and
the buffer region extends in the first direction between the first expansion region and the central region, extends in a second direction intersecting the first direction between the first expansion region and the first outer auxiliary region, and extends in the first direction between the first edge region and the first outer auxiliary region.

3. The reflective mask as claimed in claim 1, wherein the central region includes main regions and an inner auxiliary region between the main regions.

4. The reflective mask as claimed in claim 1, further comprising:
a mask substrate;
a reflective layer on the mask substrate, the reflective layer having a multi-layered structure of alternately and repeatedly stacked first and second layers; and
an absorption layer on the reflective layer, the absorption layer including:
grating patterns in the first out-of-band region,
auxiliary patterns in the first auxiliary pattern region of the first outer auxiliary region, and
main patterns in the central region.

5. The reflective mask as claimed in claim 4, wherein the reflective layer of the first out-of-band region includes silicon nitride.

6. The reflective mask as claimed in claim 1, wherein the first out-of-band region includes material that does not reflect incident light, the incident light including at least one of extreme ultraviolet (EUV) light or deep ultraviolet (DUV) light.

7. The reflective mask as claimed in claim 1, wherein:
the second peripheral region includes a second out-of-band region and a second outer auxiliary region, the second outer auxiliary region having a second auxiliary pattern region,
the second out-of-band region includes a second edge region extending in the first direction and a second expansion region between the second edge region and the central region,
the first outer auxiliary region of the first peripheral region and the second expansion region of the second out-of-band region are symmetrical with respect to a center line extending in the first direction and passing through a center of the reflective mask, and
the first expansion region of the first out-of-band region and the second outer auxiliary region of the second peripheral region are symmetrical with respect to the center line.

8. The reflective mask as claimed in claim 7, wherein the first outer auxiliary region and the second expansion region have a same size.

9. The reflective mask as claimed in claim 7, wherein the first expansion region and the second outer auxiliary region have a same size.

10. A reflective mask, comprising:
a central region;
an out-of-band region surrounding the central region, the out-of-band region including:
a first inner sidewall and a second inner sidewall extending in a first direction along opposite sides of the central region, respectively, and
a third inner sidewall and a fourth inner sidewall extending in a second direction along opposite sides of the central region, respectively;
a first expansion region on the first inner sidewall;
a second expansion region on the second inner sidewall;
a first outer auxiliary region on the second inner sidewall; and
a second outer auxiliary region on the first inner sidewall,
wherein each of the first and second expansion regions is an expanded region of the out-of-band region,
wherein each of the first and second outer auxiliary regions is configured to transfer an auxiliary pattern in a scribe line region of a substrate,
wherein the first expansion region and the first outer auxiliary region are symmetrical with respect to a first center line extending in the first direction and passing through a center of the central region, and
wherein the second expansion region and the second outer auxiliary region are symmetrical with respect to the first center line.

11. The reflective mask as claimed in claim 10, wherein:
a size of the first expansion region is equal to a size of the first outer auxiliary region, and
a size of the second expansion region is equal to a size of the second outer auxiliary region.

12. The reflective mask as claimed in claim 10, wherein a size of the first expansion region is different from a size of the second expansion region.

13. The reflective mask as claimed in claim 10, wherein a size of the first outer auxiliary region is different from a size of the second outer auxiliary region.

14. The reflective mask as claimed in claim 10, wherein a distance in the first direction between the first expansion region and the second outer auxiliary region is equal to a distance in the first direction between the second expansion region and the first outer auxiliary region.

15. The reflective mask as claimed in claim 10, further comprising:
a third expansion region on the third inner sidewall;
a fourth expansion region on the fourth inner sidewall;
a third outer auxiliary region on the fourth inner sidewall; and
a fourth outer auxiliary region on the third inner sidewall,
wherein the third expansion region and the third outer auxiliary region are symmetrical with respect to a second center line extending in the second direction and passing through the center of the central region, and
wherein the fourth expansion region and the fourth outer auxiliary region are symmetrical with respect to the second center line.

16. A method for manufacturing a semiconductor device, the method comprising:
performing an extreme ultraviolet (EUV) lithography process on a substrate, the substrate including a first chip region, a second chip region, and a scribe line region between the first and second chip regions,
wherein performing the EUV lithography process includes:
performing a first exposure on the first chip region and the scribe line region of the substrate, such that a first exposure region on the substrate is exposed and a first blocking region on the substrate is not exposed, the first exposure region overlapping with a first region of the scribe line region, and the first blocking region overlapping with a second region of the scribe line region, and performing a second exposure on the scribe line region and the second chip region of the substrate, such that a second exposure region on the substrate is exposed and a second blocking region on the substrate is not exposed, the second exposure region overlapping with the second region of the scribe line region, and the second blocking region overlapping with the first region of the scribe line region.

17. The method as claimed in claim 16, wherein performing the EUV lithography process further includes:
   forming a first pattern region on the first region of the scribe line region by the first exposure; and
   forming a second pattern region on the second region of the scribe line region by the second exposure,
   wherein each of the first pattern region and the second pattern region includes a key pattern, a guard ring pattern, or a chemical mechanical polishing (CMP) dummy pattern, and
   wherein the first pattern region overlaps with the second blocking region.

18. The method as claimed in claim 16, wherein the first and second exposures are performed using a reflective mask, the reflective mask including:
   a central region, and
   a first peripheral region and a second peripheral region at opposite sides of the central region, respectively,
   wherein the first peripheral region includes a first expansion region expanded from an out-of-band region,
   wherein the second peripheral region includes a second expansion region expanded from the out-of-band region, and
   wherein the second blocking region overlaps with the first region of the scribe line region by the first expansion region.

19. The method as claimed in claim 18, wherein:
   the first peripheral region further includes a first outer auxiliary region adjacent to the first expansion region,
   the second peripheral region further includes a second outer auxiliary region adjacent to the second expansion region, and
   the second exposure region overlaps with the second region of the scribe line region by the first outer auxiliary region.

20. The method as claimed in claim 16, wherein:
   during the first exposure, patterns are transferred onto the first exposure region and light is blocked on the first blocking region, and
   during the second exposure, patterns are transferred onto the second exposure region and light is blocked on the second blocking region.

* * * * *